United States Patent
Buchbinder et al.

(10) Patent No.: US 11,982,887 B2
(45) Date of Patent: May 14, 2024

(54) UNDERCUT THERMO-OPTIC PHASE SHIFTER

(71) Applicant: Ayar Labs, Inc., Santa Clara, CA (US)

(72) Inventors: Sidney Buchbinder, Berkeley, CA (US); John Fini, Albany, CA (US); Anatol Khilo, Dublin, CA (US)

(73) Assignee: Ayar Labs, Inc., Santa Clara, CA (US)

(*) Notice: Subject to any disclaimer, the term of this patent is extended or adjusted under 35 U.S.C. 154(b) by 852 days.

(21) Appl. No.: 17/070,891

(22) Filed: Oct. 14, 2020

(65) Prior Publication Data

US 2022/0113565 A1    Apr. 14, 2022

(51) Int. Cl.
*G02F 1/01* (2006.01)
*G02B 6/136* (2006.01)
*H01S 5/026* (2006.01)
*H01S 5/06* (2006.01)

(52) U.S. Cl.
CPC .......... *G02F 1/0147* (2013.01); *G02B 6/136* (2013.01); *G02F 1/011* (2013.01); *H01S 5/026* (2013.01); *H01S 5/0612* (2013.01); *G02F 2201/06* (2013.01); *G02F 2203/50* (2013.01)

(58) Field of Classification Search
CPC .......................... H01S 5/06255; G02F 2201/06
USPC .................................................. 372/38.02, 26
See application file for complete search history.

(56) References Cited

U.S. PATENT DOCUMENTS

| | | | |
|---|---|---|---|
| 9,740,079 B1 | 8/2017 | Davids et al. | |
| 2010/0111461 A1* | 5/2010 | Takahashi | G02F 1/0147 385/1 |
| 2012/0064686 A1 | 3/2012 | Farber et al. | |
| 2015/0153512 A1 | 6/2015 | Grote et al. | |
| 2018/0113332 A1 | 4/2018 | Kwack et al. | |
| 2018/0143462 A1* | 5/2018 | Gill | G02B 6/136 |
| 2018/0143463 A1 | 5/2018 | Han et al. | |
| 2018/0173025 A1* | 6/2018 | McGreer | G02F 1/2257 |

OTHER PUBLICATIONS

International Application No. PCT/US21/54925, International Search Report and Written Opinion of the International Searching Authority, dated Jan. 18, 2022.

* cited by examiner

*Primary Examiner* — Tuan N Nguyen
(74) *Attorney, Agent, or Firm* — Penilla IP, APC

(57) ABSTRACT

A thermo-optic phase shifter includes a substrate having a cavity formed into an upper region of the substrate. The thermo-optic phase shifter includes an optical waveguide disposed above the substrate. The optical waveguide extends across and above the cavity. The thermo-optic phase shifter also includes a heater device disposed along a lateral side of the optical waveguide. The heater device extends across and above the cavity. The cavity is formed by an undercut etching process after the optical waveguide and the heater device is formed. The optical waveguide can be formed to include one or more segments that pass over the cavity. Also, a second heater device can be included such that the one or more segments of the optical waveguide that extend over the cavity are bracketed by heater devices. Thermal transmission structures can be included to enhance heat transfer between the heater device(s) and the optical waveguide.

22 Claims, 19 Drawing Sheets

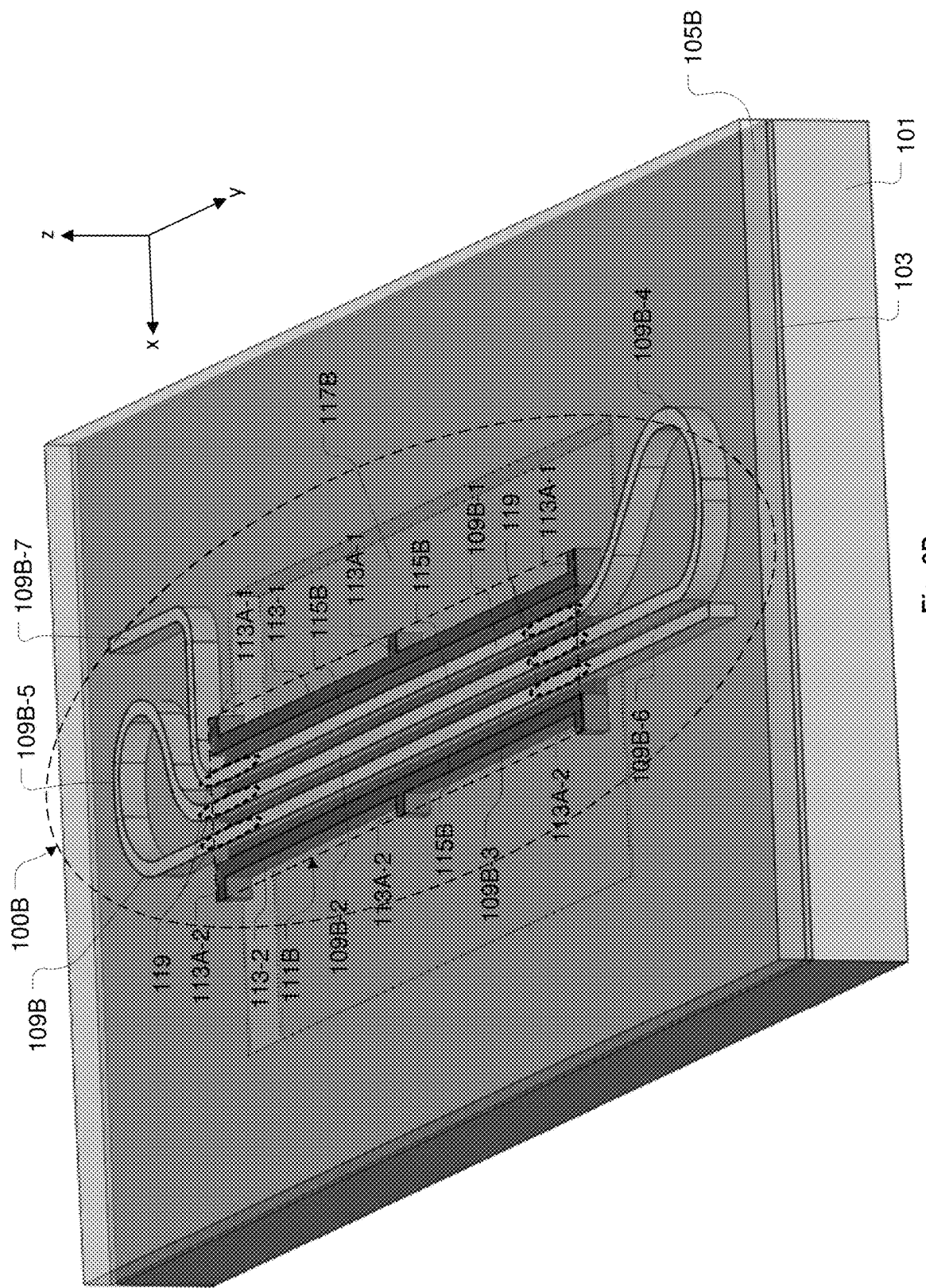

UNDERCUT THERMO-OPTIC PHASE SHIFTER

BACKGROUND

Optical data communication systems operate by modulating laser light to encode digital data patterns. The modulated laser light is transmitted through an optical data network from a sending node to a receiving node. The modulated laser light that arrives at the receiving node is de-modulated to obtain the original digital data patterns. In some optical data communication systems, transmission of laser light, modulation of laser light, transmission of modulated light, and/or de-modulation of modulated light is/are affected by a phase of the light. Therefore, in some optical data communication systems it is necessary to control the phase of light to enable reliable and efficient operation of the optical data communication system. Also, control of the phase of light transmitted through an optical waveguide can be necessary in various applications that may or may not involve optical data communication, such as in applications that include optical analog modulation, among other applications. It is within this context that the present invention arises.

SUMMARY

In an example embodiment, a thermo-optic phase shifter is disclosed. The thermo-optic phase shifter includes a substrate having a cavity formed into an upper region of the substrate. The thermo-optic phase shifter also includes an optical waveguide disposed above the substrate. The optical waveguide extends across and above the cavity. The thermo-optic phase shifter also includes a heater device disposed along a lateral side of the optical waveguide. The heater device extends across and above the cavity.

In an example embodiment, a method is disclosed for manufacturing a thermo-optic phase shifter. The method includes having a substrate of a semiconductor chip. The method also includes forming an optical waveguide above the substrate. The method also includes forming a heater device along a lateral side of a segment of the optical waveguide. The method also includes forming a cavity within the substrate, such that the cavity forms a continuous open region below the heater device and below the segment of the optical waveguide.

Other aspects and advantages of the invention will become more apparent from the following detailed description, taken in conjunction with the accompanying drawings, illustrating by way of example the present invention.

BRIEF DESCRIPTION OF THE DRAWINGS

FIG. 6B shows a perspective view of the thermo-optic phase shifter as shown in FIG. 5B with the BEOL region removed to provide a clearer view of the thermo-optic phase shifter, in accordance with some embodiments.

DETAILED DESCRIPTION

In the following description, numerous specific details are set forth in order to provide an understanding of the present invention. It will be apparent, however, to one skilled in the art that the present invention may be practiced without some or all of these specific details. In other instances, well known process operations have not been described in detail in order not to unnecessarily obscure the present invention.

Figure 1A:
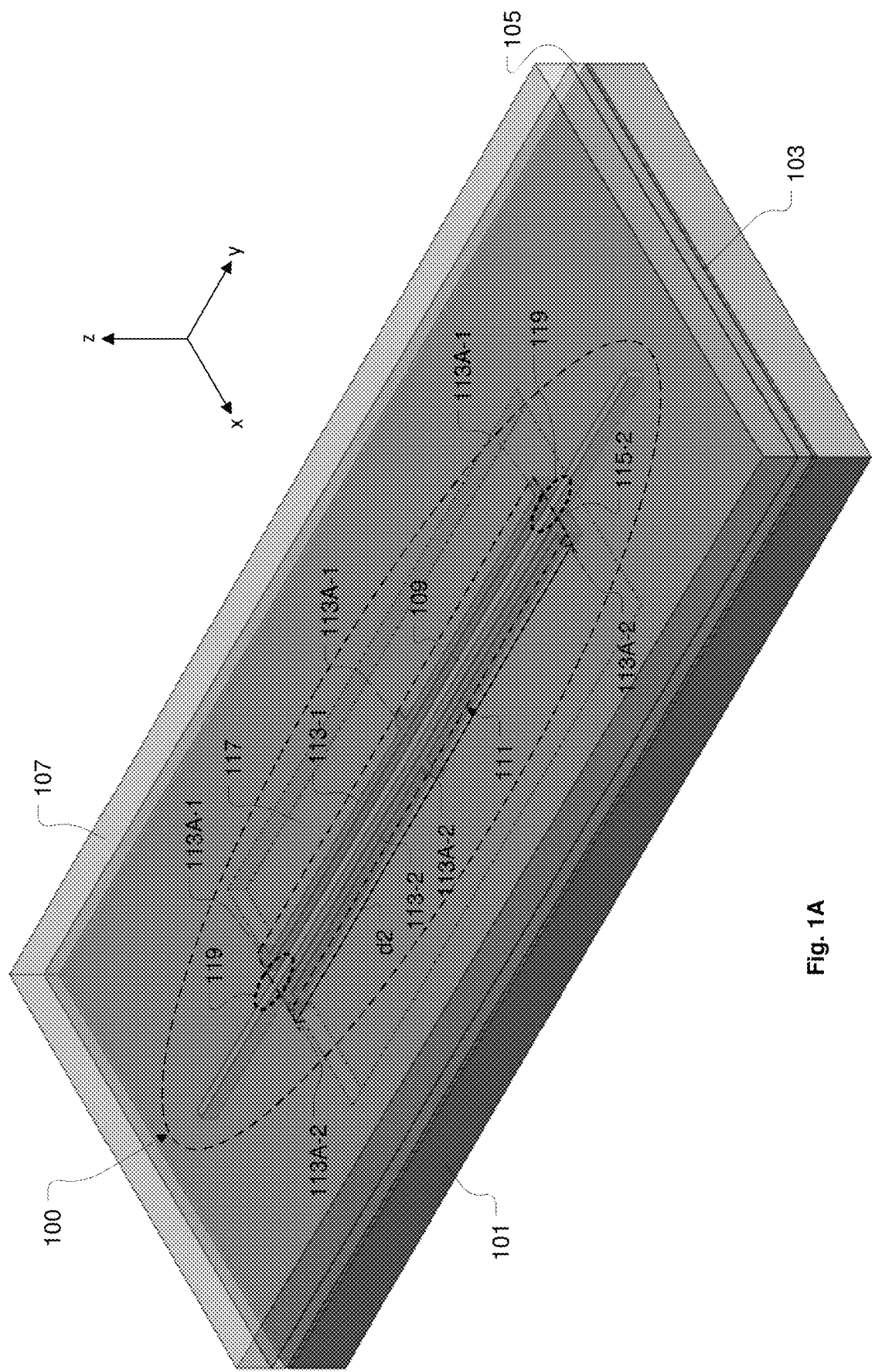
FIG. 1A shows an isometric view of a thermo-optic phase shifter, in accordance with some embodiments.
Figure 1B:
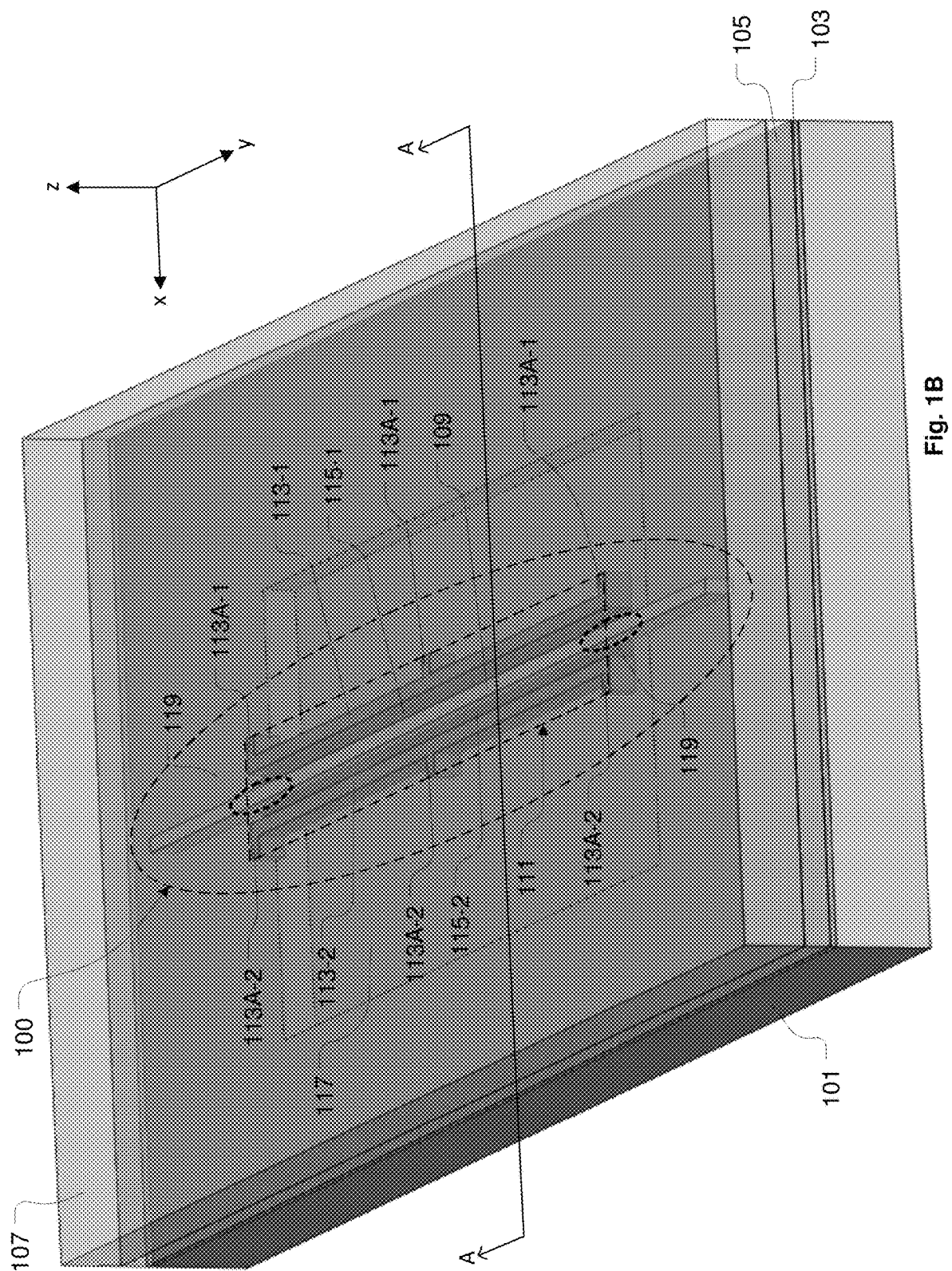
FIG. 1B shows a perspective view of the thermo-optic phase shifter of FIG. 1A, in accordance with some embodiments.
Figure 1C:
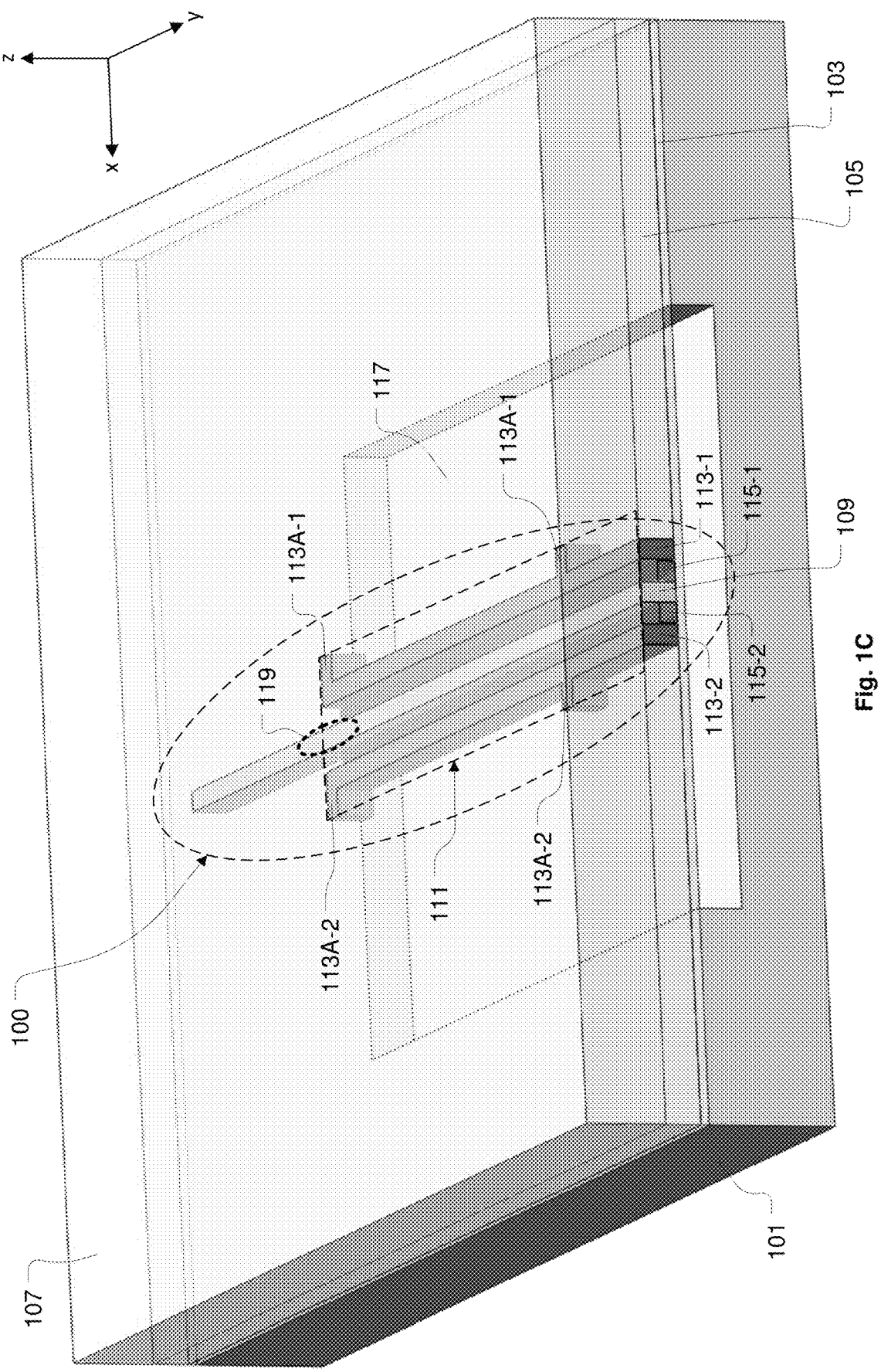
FIG. 1C shows a vertical cross-section through the perspective view of the thermo-optic phase shifter, referenced as View A-A in FIG. 1B, in accordance with some embodiments.
Figure 1D:
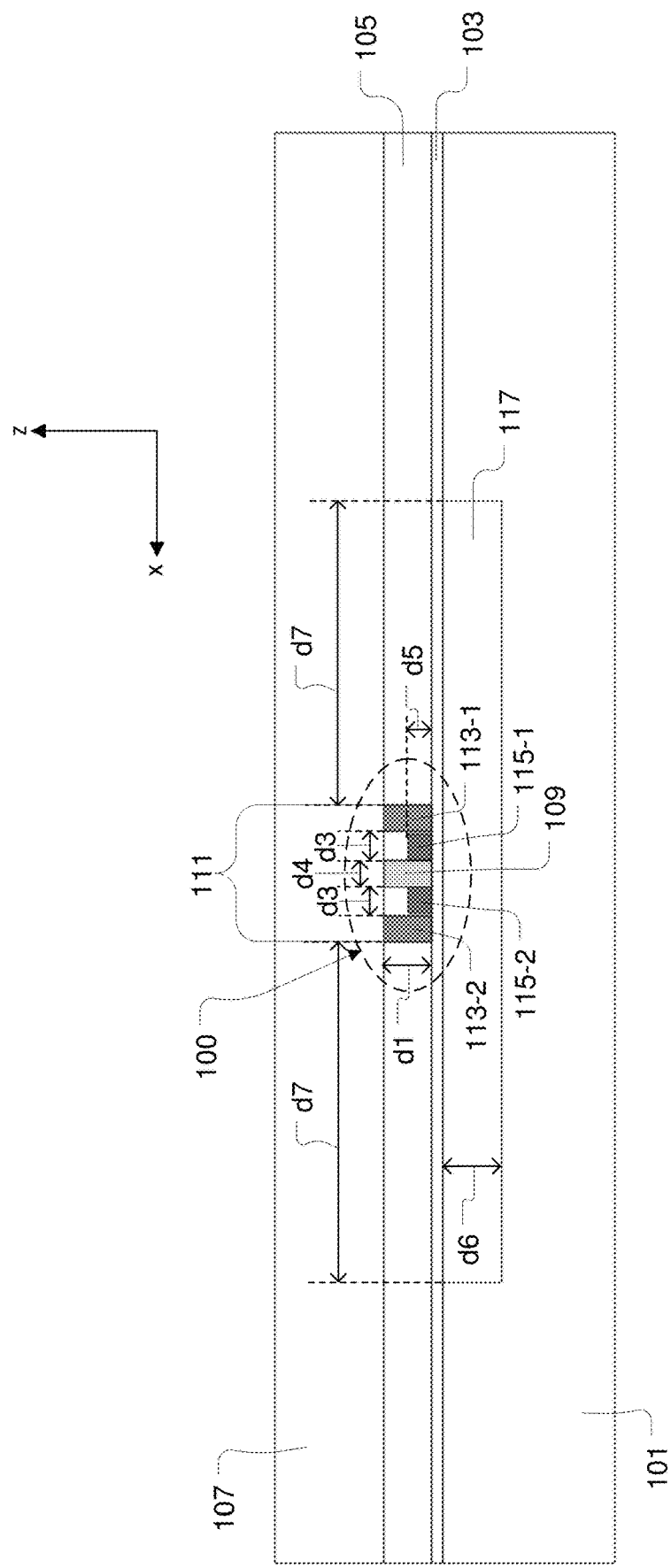
FIG. 1D shows the thermo-optic phase shifter of FIG. 1A within a plane of the vertical cross-section referenced as View A-A in FIG. 1B, in accordance with some embodiments.

FIG. 1A shows an isometric view of a thermo-optic phase shifter 100, in accordance with some embodiments. FIG. 1B shows a perspective view of the thermo-optic phase shifter 100, in accordance with some embodiments. FIG. 1C shows a vertical cross-section through the perspective view of the thermo-optic phase shifter 100, referenced as View A-A in FIG. 1B, in accordance with some embodiments. FIG. 1D shows the thermo-optic phase shifter 100 within a plane of the vertical cross-section referenced as View A-A in FIG. 1B, in accordance with some embodiments. In some embodiments, the thermo-optic phase shifter 100 is formed as part of a semiconductor chip (or semiconductor die) through complementary metal oxide semiconductor (CMOS) fabrication processes. For ease of description the term semiconductor chip as used herein refers to both a semiconductor chip and a semiconductor die. Also, the semiconductor chip referred to herein can be considered as part of an intact semiconductor wafer before singulation of the semiconductor wafer, or can be considered as already singulated from the semiconductor wafer. In this manner, the thermo-optic phase shifter 100 is formed over a portion of a substrate 101, such as a silicon substrate. In some embodiments, the thermo-optic phase shifter 100 is formed as part of a semiconductor chip that is configured as a silicon-on-insulator (SOI) chip. In these embodiments, a buried oxide (BOX) layer 103 is formed over the substrate 101. The thermo-optic phase shifter 100 and other optical components are formed within a device layer 105 of the semiconductor chip. In some embodiments, the device layer 105 also includes silicon-based electrical devices, such as transistors and other active electrical components. Therefore, the device layer 105 is also referred to as an active layer of the semiconductor chip.

A back-end-of-line (BEOL) region 107 is formed above the device layer 105. In some embodiments, the BEOL region 107 includes one or more interconnect layer(s), where vertically adjacent interconnect layers are separated from each other by intervening dielectric material(s), such as silicon dioxide, among others. Each of the plurality of interconnect layers includes routings of conductive interconnect structures that form parts of electrical circuits to carry electrical signals. The conductive interconnect structures in a given layer of the BEOL region 107 are electrically separated from each other by intervening dielectric material(s), such as silicon dioxide, among others. The BEOL region 107 also includes conductive via structures formed to electrically connect conductive interconnect structures in different interconnect layers of the BEOL region 107. Also, in some embodiments, the BEOL region 107 and/or the substrate 101 includes optical components, such as optical grating couplers and optical waveguides to enable optical coupling to optical devices within the device layer 105, such as optical waveguides formed within the device layer 105, among other optical devices.

Figure 2A:
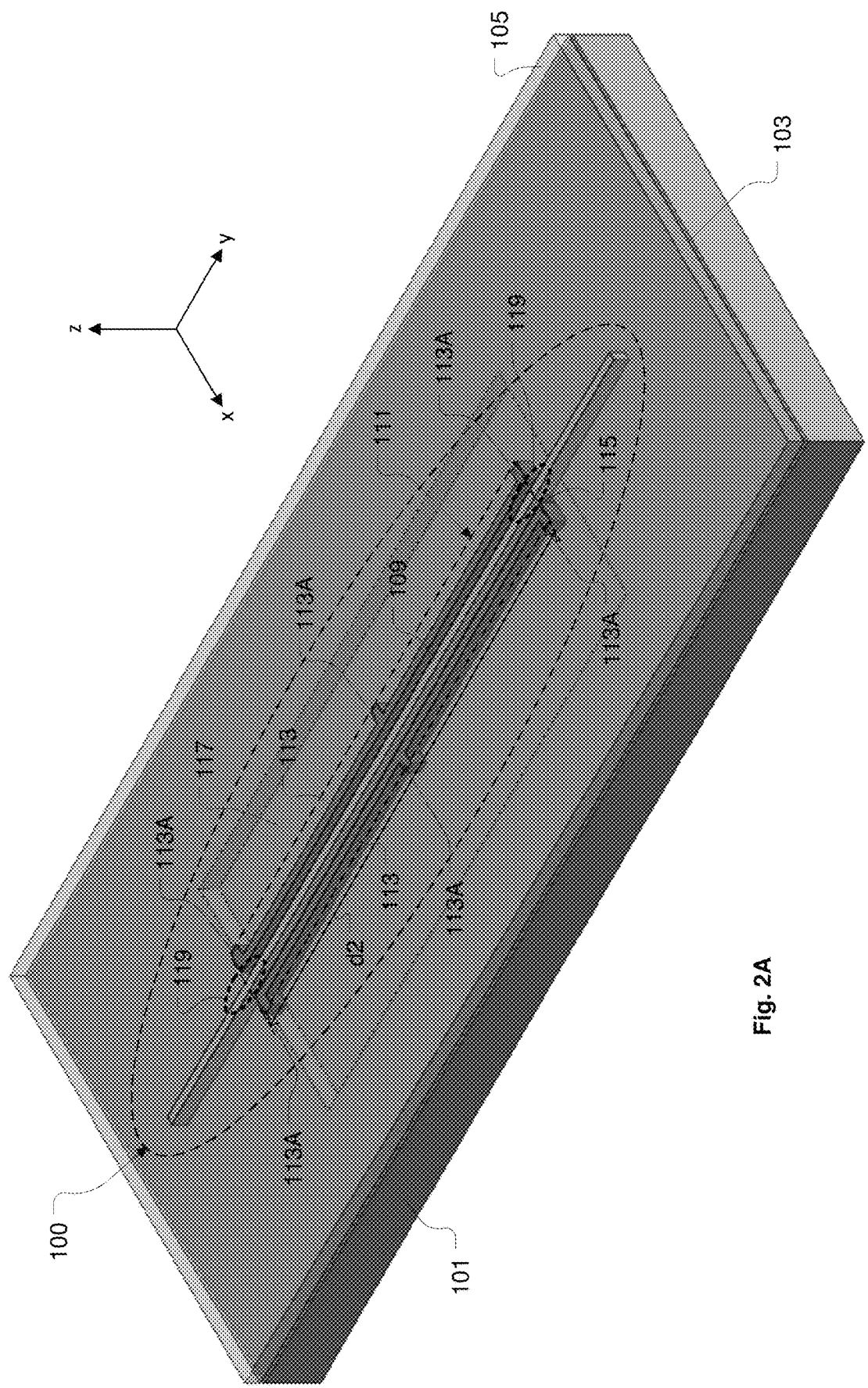
FIG. 2A shows the isometric view of the thermo-optic phase shifter as shown in FIG. 1A with the back-end-of-line (BEOL) region removed to provide a clearer view of the thermo-optic phase shifter, in accordance with some embodiments.
Figure 2B:
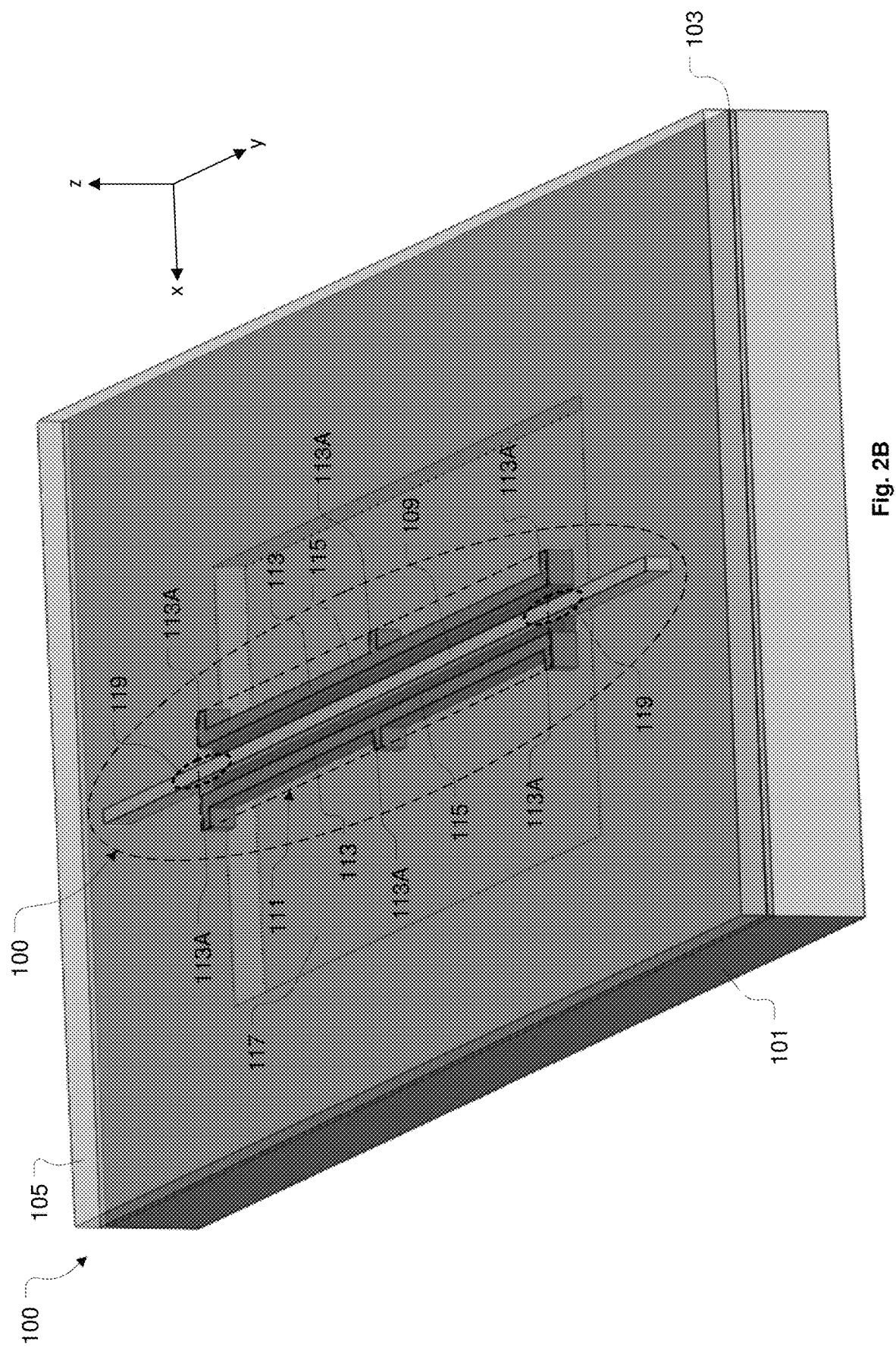
FIG. 2B shows a perspective view of the thermo-optic phase shifter as shown in FIG. 1B with the BEOL region removed to provide a clearer view of the thermo-optic phase shifter, in accordance with some embodiments.

FIG. 2A shows the isometric view of the thermo-optic phase shifter 100 as shown in FIG. 1A with the BEOL region 107 removed to provide a clearer view of the thermo-optic phase shifter 100, in accordance with some embodiments. FIG. 2B shows a perspective view of the thermo-optic phase shifter 100 with the BEOL region 107 removed to provide a clearer view of the thermo-optic phase shifter 100, in accordance with some embodiments. The thermo-optic phase shifter 100 includes an optical waveguide 109 that extends through a heater region 111. In some embodiments, the optical waveguide 109 is implemented in a full thickness (d1 as shown in FIG. 1D) of the device layer 105. Also, in some embodiments, the optical waveguide 109 is configured to confine an optical mode of the optical waveguide 109 within the structure of the optical waveguide 109. The heater region 111 includes one or more semiconductor heater devices 113-1, 113-2 situated near the optical waveguide 109. The one or more heater devices 113-1, 113-2 are controllable to increase an amount of thermal energy injected into the heater region 111, so as to increase a temperature of the optical waveguide 109, which has a corresponding shifting effect on the phase of light traveling through the optical waveguide 109. Also, the one or more heater devices 113-1, 113-2 are controllable to be powered down or off so as to reduce the amount of thermal energy injected into the heater region 111, so as to decrease the temperature of the optical waveguide 109, which also has a corresponding shifting effect on the phase of light traveling through the optical waveguide 109. In some embodiments, each of the heater devices 113-1, 113-2 is configured to extend along a length of the optical waveguide 109 within the heater region 111. In these embodiments, the heater devices 113-1, 113-2 are also referred to as heater arms 113-1, 113-2. In some embodiments, the heater devices 113-1, 113-2 are electrically powered heaters, such as electrically resistive heating structures.

In some embodiments, the heater devices 113-1, 113-2 are respectively configured as two silicon heating structures 113-1, 113-2, with the two silicon heating structures 113-1, 113-2 respectively located along longitudinal edges of the thermo-optic phase shifter 100. In some embodiments, the two silicon heating structures 113-1, 113-2 are doped with electrical charge carriers to define a specified electrical resistance within the two silicon heating structures 113-1, 113-2 that enables them to function as electrically resistive heating structures. In some embodiments, the two silicon heating structures 113-1, 113-2 are implemented in a full thickness (d1 as shown in FIG. 1D) of the device layer 105 and are doped to achieve low electrical resistivity. When electrical current is transmitted through the heater device 113-1, 113-2, thermal energy is transmitted from the heater device 113-1, 113-2 into the optical waveguide 109, which causes an increase in temperature of the optical waveguide 109 and correspondingly induces a change in the optical refractive index of the optical waveguide 109, e.g., silicon waveguide 109, through the thermo-optic effect. Similarly, when electrical current transmitted through the heater device 113-1, 113-2 is reduced or shut off, thermal energy transmitted from the heater device 113-1, 113-2 into the optical waveguide 109 is reduced, which causes a decrease in temperature of the optical waveguide 109 and correspondingly induces a change in the optical refractive index of the optical waveguide 109, e.g., silicon waveguide 109, through the thermo-optic effect.

In some embodiments, each of the one or more heater devices 113-1, 113-2 is arranged in an interleaved segmented topology, so that for a given total length d2 of the thermo-optic phase shifter 100, lower electrical resistance is achieved. With the heater devices 113-1, 113-2 configured in the interleaved segmented topology, multiple contact portions 113A-1, 113A-2 are provided along the length of the heater devices 113-1, 113-2. Each adjacently positioned pair of contact portions 113A-1, 113A-2 along a given heater device 113-1, 113-2 correspond to respective ends of a heater segment within the given heater device 113-1, 113-2. In some embodiments, for a total length of a given heater device 113-1, 113-2, a number of heater segments is implemented so as to subdivide the given heater device 113-1, 113-2 into smaller segments and thereby reduce the electrical resistance seen by an electrical supply used to power the given heater device 113-1, 113-2. For each adjacently positioned pair of contact portions 113A-1, 113A-2 along a given heater device 113-1, 113-2, a first contact portion 113A-1, 113A-2 of the adjacently positioned pair of contact portions 113A-1, 113A-2 is electrically connected to a first electrical potential, and a second contact portion 113A-1, 113A-2 of the adjacently positioned pair of contact portions 113A-1, 113A-2 is electrically connected to a second electrical potential, where either the first electrical potential is greater than the second electrical potential, or the second electrical potential is greater than the first electrical potential, such that an electrical current will flow between the adjacently positioned pair of contact portions 113A-1, 113A-2. In some of these embodiments, the contact portions 113A-1, 113A-2 that are electrically connected to the first electrical potential are wired in parallel, and the contact portions 113A-1, 113A-2 that are electrically connected to the second electrical potential are wired in parallel.

In some embodiments, a magnitude relationship between the first electrical potential and the second electrical potential is maintained in a substantially steady state such that the heater segment that is bounded by the adjacently positioned pair of contact portions 113A-1, 113A-2 operates in a direct current manner. However, in some embodiments, a magnitude relationship between the first electrical potential and the second electrical potential is alternated as a function of time such that the heater segment that is bounded by the adjacently positioned pair of contact portions 113A-1, 113A-2 operates in an alternating current manner. Also, in some embodiments, the heater devices 113-1, 113-2, and/or particular heater segments therein, are operated in a modulated manner, such that a presence and/or a magnitude and/or a direction of electrical current flow through the heater devices 113-1, 113-2, and/or particular heater segments therein, is controlled as a function of time. In some embodiments, operation of the heater devices 113-1, 113-2, and/or particular heater segments therein, in the alternating current manner or in the modulated manner is used to manage electromagnetic reliability of the heater devices 113-1, 113-2. Also, in some embodiments, operation of the heater devices 113-1, 113-2, and/or particular heater segments therein, in the modulated manner enables operation of the thermo-optic phase shifter 100 to provide for dynamical modulation of the phase of the light traveling through the optical waveguide 109.

The contact portions 113A-1, 113A-2 of the heater devices 113-1, 113-2 facilitate supply of electrical signals to the heater devices 113-1, 113-2. In some embodiments, the contact portions 113A-1, 113A-2 of the heater devices 113-1, 113-2 are configured to receive metal contacts, e.g., conductive via structures, that are electrically connected to corresponding wiring, e.g., to corresponding conductive interconnect structures, within the BEOL layer 107. As mentioned above, the contact portions 113A-1, 113A-2 are distributed along the length of the heater devices 113-1, 113-2. Also, the locations of the contactportions 113A-1, 113-2 along the length of the heater devices 113-1, 113-2 depend on the number of segments within the heater devices 113-1, 113-2. In various embodiments, the contact portions 113A-1, 113A-2 of the heater devices 113-1, 113-2 are located within the heater region 111 and can extend outside of the heater region 111 (laterally outward, e.g., parallel to the x-y plane, from the thermo-optical phase shifter 100), if required to meet electrical requirements and fabrication requirements. In some embodiments, the contact portions 113A-1, 113A-2 of the heater devices 113-1, 113-2 are configured to comply with design rule checking (DRC) requirements of the fabrication process to ensure reliability of electrical contacts, e.g., via contacts, made to the heater devices 113-1, 113-2. In some embodiments, a size and orientation of the contact portions 113A-1, 113A-2 and associated electrically conductive contacts, e.g., via contacts, and wiring are parameterized to foundry reliability rules for the electric current that will pass through the heater devices 113-1, 113-2.

In some embodiments, the length d2 and topology of the heater devices 113-1, 113-2 are specified to target a certain electrical impedance presented to the circuitry driving the heater devices 113-1, 113-2. The length d2 of the heater devices 113-1, 113-2 is traded off with the temperature required to affect the desired light phase shift within the optical waveguide 109. For example, as the length d2 of thermo-optic phase shifter 100 and the heater devices 113-1, 113-2 therein increases, the temperature required to achieve a given shift in light phase within the optical waveguide 109 decreases. The length d2 and topology (interleaved segment count) of the heater devices 113-1, 113-2 depends on the material and fabrication technology. In some embodiments, the length d2 of the heater region 111 (the length d2 of the heater devices 113-1, 113-2 within the thermo-optic phase shifter 100) is within a range extending from about 10 micrometers to about 1000 micrometers. In some embodiments, the length d2 of the heater region 111 is within a range extending from about 50 micrometers to about 500 micrometers. In some embodiments, the length d2 of the heater region 111 is within a range extending from about 100 micrometers to about 200 micrometers.

The optical waveguide 109 is positioned between the heater devices 113-1, 113-2. The optical waveguide 109 is also positioned in close proximity to the heater devices 113-1, 113-2 to reduce the thermal impedance between the heater devices 113-1, 113-2 and the optical waveguide 109, so that a temperature change in the heater devices 113-1, 113-2 will efficiently affect a similar temperature change in the optical waveguide 109. A distance d3 between the optical waveguide 109 and a given heater device 113-1, 113-2 is chosen to provide optical confinement and low loss of the primary optical mode within the optical waveguide 109, while minimizing the thermal impedance between the optical waveguide 109 and the given heater device 113-1, 113-2. A low thermal impedance between the given heater device 113-1, 113-2 and the optical waveguide 109 improves the phase-shift tuning efficiency of the thermo-optic phase shifter 100 and generally relaxes electrical supply requirements of the given heater device 113-1, 113-2, so that lower electric current, voltage, and/or electric power are required to induce a desired light phase shift within the optical waveguide 109.

In various embodiments, the optical waveguide 109 is formed of a material that is capable of functioning as an optical waveguide, such as silicon, among other materials. Also, the surrounding material(s) relative to the optical waveguide 109, laterally (parallel to the x-y plane) and/or vertically (parallel to the z-axis), has an optical index of refraction that enables the surrounding material(s) to function as an optical cladding material for the optical waveguide 109. In some embodiments, the vertical size d1 of the optical waveguide 109 (as measured parallel to the z-axis) is within a range extending from about 50 nanometers to about 400 nanometers. In some embodiments, the vertical size d1 of the optical waveguide 109 is within a range extending from about 100 nanometers to about 300 nanometers. In some embodiments, the vertical size d1 of the optical waveguide 109 is about 220 nanometers. In some embodiments, a width d4 of the optical waveguide 109 (as measured parallel to the x-y plane in a direction substantially perpendicular to the lateral sides of the optical waveguide 109) is set to support a single optical mode within the optical waveguide 109. Therefore, the width d4 of the optical waveguide 109 varies with and is optimized for a given technology platform and material cross-section. In some embodiments, the width d4 of the optical waveguide 109 is within a range extending from about 200 nanometers to about 1 micrometer. In some embodiments, the width d4 of the optical waveguide 109 is within a range extending from about 300 nanometers to about 500 nanometers. In some embodiments, the width d4 of the optical waveguide 109 is within a range extending from about 325 nanometers to about 450 nanometers.

In some embodiments, the thermo-optic phase shifter 100 includes an optical mode converter 119 at one or more of the locations where the optical waveguide 109 enters and/or exits the heater region 111, relative to the direction of the light transmission through the optical waveguide 109. The optical mode converter 119 is designed to transition the primary optical mode of the optical waveguide 109 from that of an isolated optical waveguide outside of the heater region 111 to that of an optical waveguide embedded within the surrounding materials that are present within the heater region 111, so as to ensure that the optical mode along the length of the optical waveguide 109 is suitable for propagation of light through the optical waveguide 109 within the heater region 111 without adverse loss and/or reflection of light. In this manner, the portion of the optical waveguide 109 within the heater region 111 can have different physical dimensions than portions of the optical waveguide 109 outside of the heater region 111. In some embodiments, the optical mode converter 119 is configured as part of the optical waveguide 109 itself. More specifically, in some embodiments, the optical mode converter 119 is formed by gradual changes in the geometry of the optical waveguide 109 that enables transition from one optical mode within the optical waveguide 109 to another optical mode within the optical waveguide 109. For example, in some embodiments, the optical mode converter 119 is configured as a tapering of the width d4 of the optical waveguide 109 over a specified length of the optical waveguide 109. Also, in some embodiments, a tapered width d4 region of the optical waveguide 109 that forms the optical mode converter 119 is substantially symmetric on each lateral side of the optical waveguide 109.

In various embodiments, use of the optical mode converter(s) 119 is optional and depends upon the dissimilarity between the optical mode of the optical waveguide 109 outside of the heater region 111 and the optical mode of the optical waveguide 109 inside of the heater region 111. Use of the optical mode converter(s) 119 helps to mitigate undesired light loss and/or light reflection as the light travels through the optical waveguide 109 into the heater region 111 and out of the heater region 111. However, in some embodiments, the optical mode of the optical waveguide 109 outside of the heater region 111 and the optical mode of the optical waveguide 109 within the heater region 111 are sufficiently similar that use of optical mode converter(s) 119 is not required to achieve acceptable performance of the thermo-optical phase shifter 100.

In some embodiments, the region between the heater devices 113-1, 113-2 and the optical waveguide 109 is formed of an optical cladding material that provides sufficiently low thermal impedance. However, in some embodiments, the thermo-optic phase shifter 100 includes thermal transmission structures 115-1, 115-2 disposed between the heater devices 113-1, 113-2, respectively, and the optical waveguide 109. In some embodiments, the thermal transmission structures 115-1, 115-2 are formed as silicon structures in thermal conduction with both the heater devices 113-1, 113-2, respectively, and the optical waveguide 109. For example, in some embodiments, the thermal transmission structures 115-1, 115-2 are formed as thinned silicon regions that physically contact both the adjacent heater device 113-1, 113-2, respectively, and the optical waveguide 109. The thermal transmission structures 115-1, 115-2 serve to lower the thermal impedance between the heater devices 113-1, 113-2, respectively, and the optical waveguide 109. In some embodiments, a vertical size d5 (as measured parallel to the z-axis) of the thermal transmission structures 115-1, 115-2 is set to keep the primary optical mode of the optical waveguide 109 sufficiently contained inside the optical waveguide 109. In some embodiments, the vertical size d5 of the thermal transmission structures 115-1, 115-2 is smaller than the vertical size d1 of the optical waveguide 109. In some embodiments, the vertical size d5 of the thermal transmission structures 115-1, 115-2 is within a range extending from a value greater than zero up to about 200 nanometers. In some embodiments, the vertical size d5 of the thermal transmission structures 115-1, 115-2 is within a range extending from about 10 nanometers to about 100 nanometers. In some embodiments, the vertical size d5 of the thermal transmission structures 115-1, 115-2 is within a range extending from about 30 nanometers to about 80 nanometers. In some embodiments, the thermal transmission structures 115-1, 115-2 are formed as thinned portions of a silicon layer that is lithographically masked and etched to form both the optical waveguide 109 and the thermal transmission structures 115-1, 115-2. Configuration of the thermal transmission structures 115-1, 115-2 as respective thinned portions of the silicon layer provides for confinement of the optical mode of the optical waveguide 109 within the optical waveguide 109.

A cavity 117 is formed within the substrate 101 below the thermo-optic phase shifter 100. In some embodiments, the cavity 117 is formed using an undercut etching process. More specifically, in some embodiments, after the thermo-optic phase shifter 100 is formed on the substrate 101, an undercut etching process is performed to remove portions of the substrate 101 in a manner that results in formation of the cavity 117. An example undercut etching process usable to form the cavity 117 is described in "A Novel Approach to Photonic Packaging Leveraging Existing High-Throughput Microelectronics Facilities," by Tymon Barwicz et al., IEEE Journal of Selected Topics in Quantum Electronics, Volume 22, No. 6, November/December 2016 ("Barwicz" hereafter), which is incorporated herein by reference in its entirety for all purposes. It should be understood, however, that undercut etching processes other than those described in Barwicz can also be used to form the cavity 117. In some embodiments, the undercut etching process is performed on the substrate 101 before fabrication of the BEOL layer 107. In some embodiments, the undercut etching process includes formation of an arrangement of openings (e.g., holes, slits, and/or trenches) through both the device layer 105 and BOX layer 103 within an area outside of the heater region 111, followed by etching of portions of the substrate 101 through the arrangement of openings, with the etching of the portions of the substrate 101 undercutting the BOX layer 107 so as to form the cavity 117 as a continuous open region below the thermo-optic phase shifter 100. A distribution of openings in the arrangement of openings is defined to enable formation of the continuous open region below the thermo-optic phase shifter 100. For example, in some embodiments, the arrangement of openings is defined in a grid pattern around the heater region 111 of the thermo-optic phase shifter 100. The openings through which the substrate 101 undercut etching process is performed allow the undercut etchant to reach the substrate 101, e.g., silicon substrate, beneath the light phase shifting region (heater region 111) of the thermo-optic phase shifter 100. During undercut etching of the substrate 101, the undercut etchant removes some of the substrate 101 from underneath the thermo-optic phase shifter to form the open cavity 117 that extends in a continuous manner beneath the thermo-optic phase shifter 100. The openings through which the substrate 101 undercut etching process is performed are sized and spaced apart from each other to ensure that the undercut regions within the substrate 101 that are associated with the various openings merge to form the continuous cavity 117 beneath the thermo-optic phase shifter 100.

The cavity 117 is designed in conjunction with the heater devices 113-1, 113-2 and optical waveguide 109 to ensure that the thermo-optic phase shifter 100 is fully undercut, such that a specified thickness of the substrate 101 beneath the thermo-optic phase shifter 100 is removed over the substantially entire area underlying the thermo-optic phase shifter 100, including at the location underlying the middle of the thermo-optic phase shifter structure 100 over which the optical waveguide 109 resides. In some embodiments, the openings through which the substrate 101 undercut etching process is performed are subsequently sealed. In some embodiments, the cavity 117 is left open, e.g., air-filled or gas-filled. In some embodiments, the cavity 117 is partially or completely back-filled with a backfill material selected to balance thermal impedance, optical performance reliability, and/or manufacturability, among other factors. In some embodiments, rather than forming the cavity 117 by doing an undercut etch of the substrate 101 through openings formed through the device layer 105 and BOX layer 103, the cavity 117 or equivalent region is formed by doing a partial substrate 101 removal process (e.g., patterned removal of substrate 101 material) from the exposed underside of the substrate 101.

In some embodiments, the geometries of the heater devices 113-1, 113-2, the optical waveguide 109, and the openings for the substrate 101 undercut etching process are configured to enable fabrication of the cavity 117 below the thermo-optic phase shifter 100, while minimizing optical losses, scattering, reflections, and/or other impairments to the optical signal that is to be transmitted through the optical waveguide 109, and while also preventing mechanical failures within the structure of the thermo-optic phase shifter 100. The cavity 117 increases the thermal impedance between the thermo-optic phase shifter 100 and the surrounding material(s), which allows more efficient operation of the thermo-optic phase shifter 100 by reducing heat transfer to the surrounding material(s). In some embodiments, a depth d6 of the cavity 117 (as measured parallel to the z-axis) is within a range extending from about 1 micrometer to about 50 micrometers. In some embodiments, the depth d6 of the cavity 117 is within a range extending from about 5 micrometers to about 20 micrometers. In some embodiments, the depth d6 of the cavity 117 is within a range extending from about 8 micrometers to about 15 micrometers. In some embodiments, the depth d6 of the cavity 117 is dependent upon the technology used for fabrication and the undercut etching process used to form the cavity 117. A larger depth d6 of the cavity 117 provides better thermal efficiency of the thermo-optic phase shifter 100. However, beyond an effective depth d6 of the cavity 117, the improvement in thermal efficiency of the thermo-optic phase shifter 100 is inconsequential. Also, the depth d6 of the cavity 117 is defined to ensure the mechanical integrity of the overall structure of the thermo-optic phase shifter 100. The cavity 117 is designed to extend far enough laterally (in the direction parallel to the x-y plane) from the thermo-optic phase shifter 100 to achieve sufficient thermal isolation between the thermo-optic phase shifter 100 and neighboring features/components within the device layer 105. In some embodiments, a lateral extension d7 of the cavity 117 beyond the heater devices 113 (as measured parallel to the x-y plane) is within a range extending from about 1 micrometer to about 100 micrometers. In some embodiments, the lateral extension d7 of the cavity 117 beyond the heater devices 113 is within a range extending from about 5 micrometers to about 50 micrometers. In some embodiments, the lateral extension d7 of the cavity 117 beyond the heater devices 113 is within a range extending from about 10 micrometers to about 30 micrometers. The thermal isolation of the thermo-optic phase shifter 100 increases as the lateral extension d7 of the cavity 117 increases. Therefore, as the lateral extension d7 of the cavity 117 increases, the thermal tuning efficiency of the thermo-optic phase shifter 100 increases. However, beyond an effective lateral extension d7 of the cavity 117, the improvement in thermal tuning efficiency of the thermo-optic phase shifter 100 is inconsequential. Also, the lateral extension d7 of the cavity 117 is defined to ensure the mechanical integrity of the overall structure of the thermo-optic phase shifter 100. The cavity 117 functions as a thermal insulator to help retain thermal energy within the thermo-optic phase shifter 100, which in turn improves the precision of temperature control of the optical waveguide 109, reduces an amount energy required by the heater devices 113-1, 113-2 to reach and maintain a prescribed temperature of the optical waveguide 109, and helps mitigate thermal transfer to electrical devices and/or optical devices that are formed near the thermo-optic phase shifter 100 within the device layer 105.

In view of the foregoing, the thermo-optic phase shifter 100 includes one or more heater device(s) 113-1, 113-2 positioned near the optical waveguide 109. In some embodiments, the heater devices 113 includes two silicon heater arms configured and positioned along respective lateral sides of the optical waveguide 109 to provide efficient heating of the optical waveguide 109. The cavity 117 is formed below the thermo-optic phase shifter 100 to improve the thermal tuning efficiency of thermo-optical phase shifter 100 by increasing the thermal impedance between the thermo-optic phase shifter 100 and the material(s) surrounding the thermo-optic phase shifter 100. In some embodiments, the heater device(s) 113-1, 113-2 and the optical waveguide 109 are formed in the device layer 105, e.g., the active semiconductor layer, that is fabricated in-part by lithographic patterning processes and etching processes, including full-etching and/or partial etching processes. In some embodiments, the optical waveguide 109 is configured as a full-thickness optical waveguide, where the vertical size d1 of the optical waveguide 109 is substantially the same as the vertical thickness of the device layer 105. Also, the thermal transmission structures 115-1, 115-2 can be optionally positioned between the optical waveguide 109 and the heater device(s) 113-1, 113-2, respectively, to improve heat transfer to the optical waveguide 109. In some embodiments, the thermal transmission structures 115-1, 115-2 are thin silicon structures formed by partial etching of a larger silicon structure that is used to form the optical waveguide 109. The thermal transmission structures 115-1, 115-2 are sized to avoid optical coupling with the primary optical mode of the optical waveguide 109 within the heater region 111.

Figure 3A:
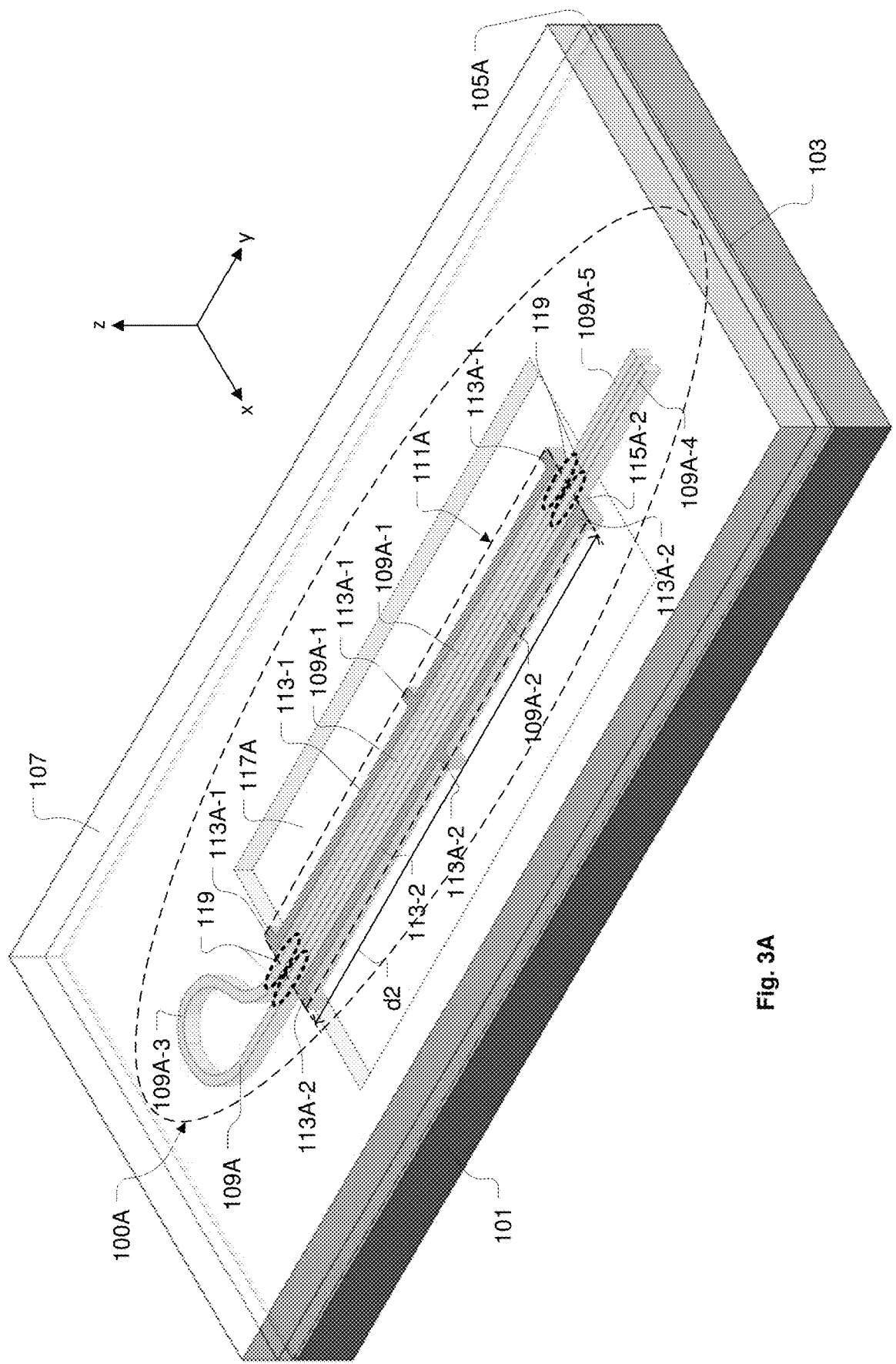
FIG. 3A shows an isometric view of a thermo-optic phase shifter, in accordance with some embodiments.
Figure 3B:
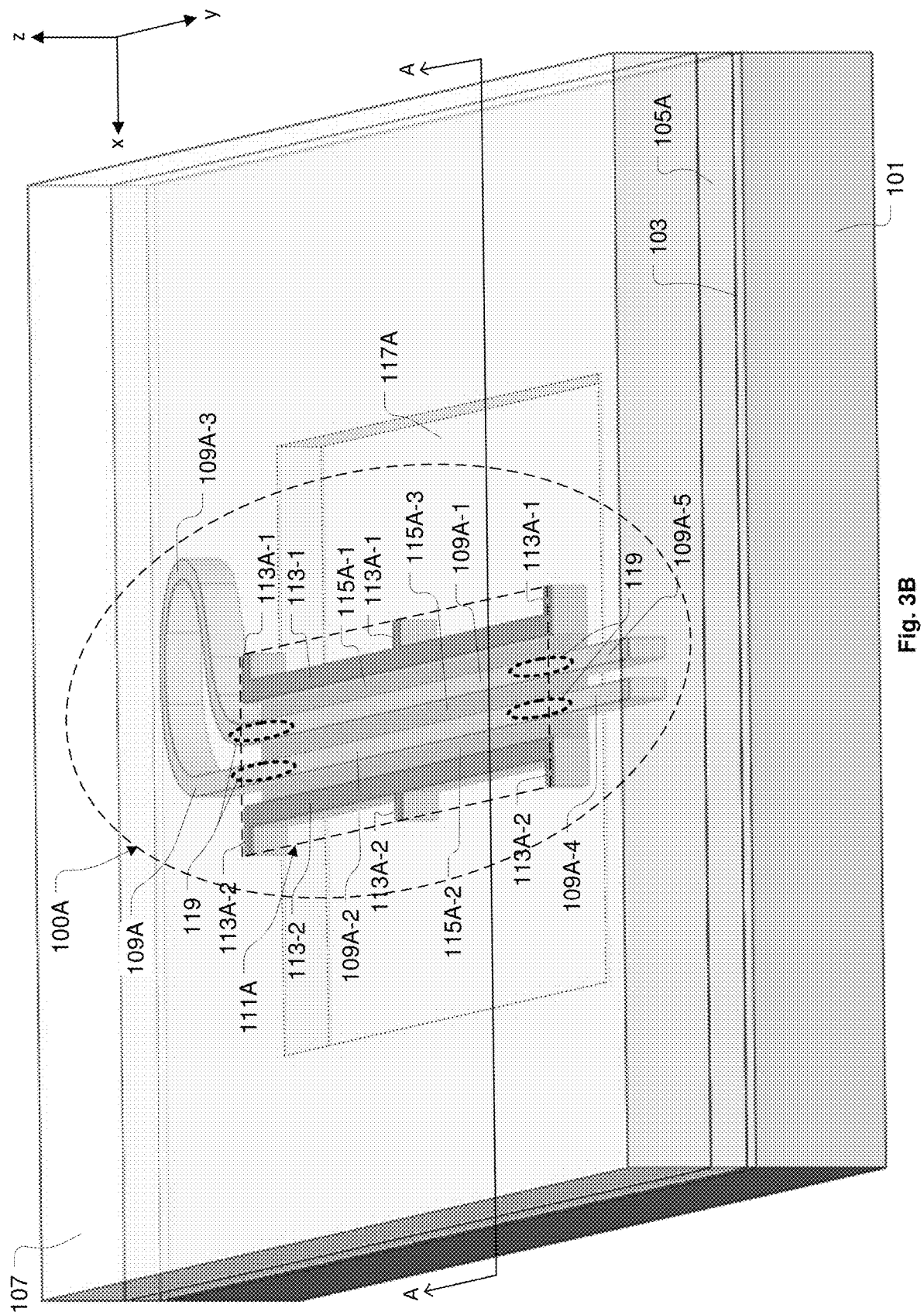
FIG. 3B shows a perspective view of the thermo-optic phase shifter of FIG. 3A, in accordance with some embodiments.
Figure 3C:
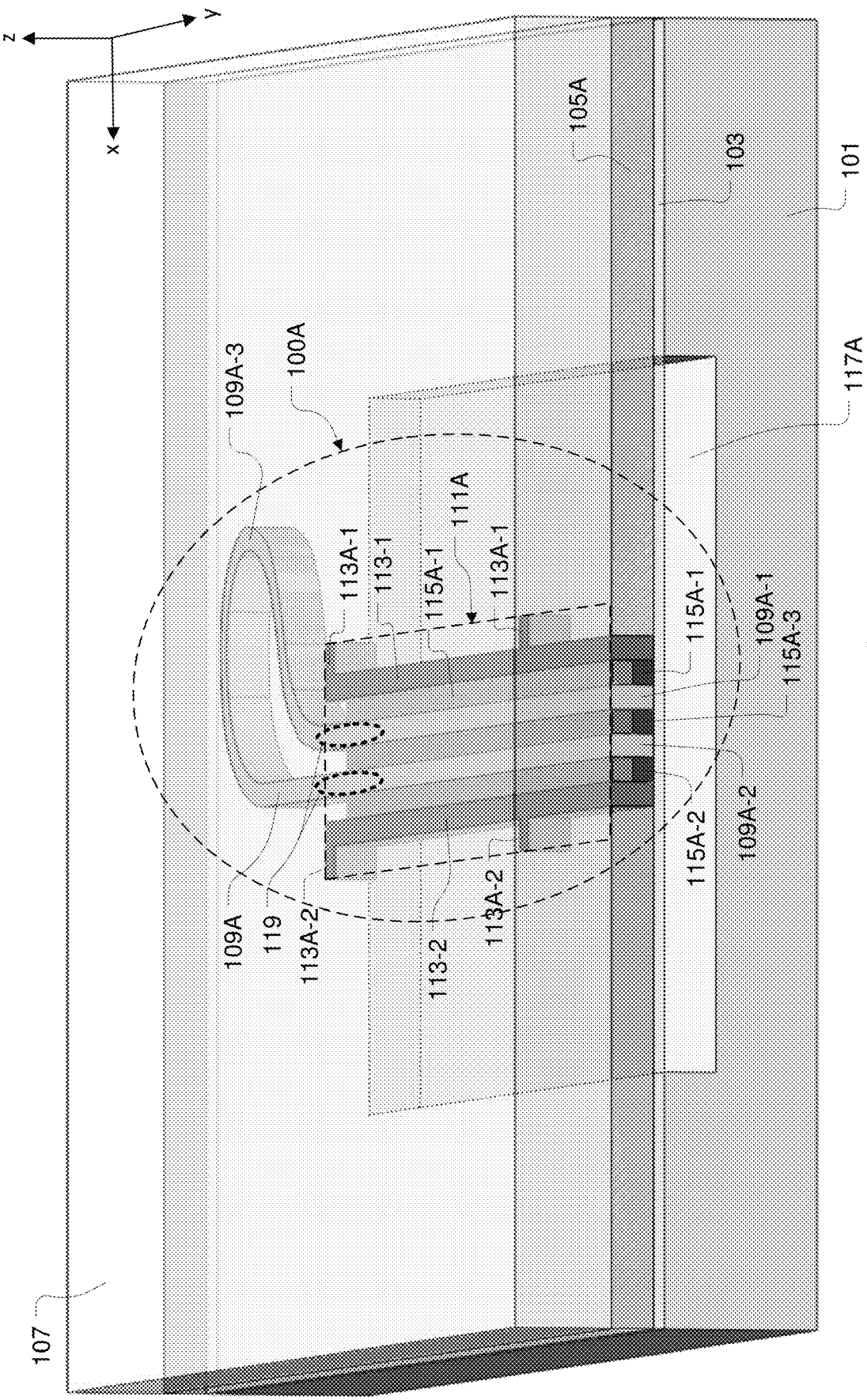
FIG. 3C shows a vertical cross-section through the perspective view of the thermo-optic phase shifter, referenced as View A-A in FIG. 3B, in accordance with some embodiments.
Figure 3D:
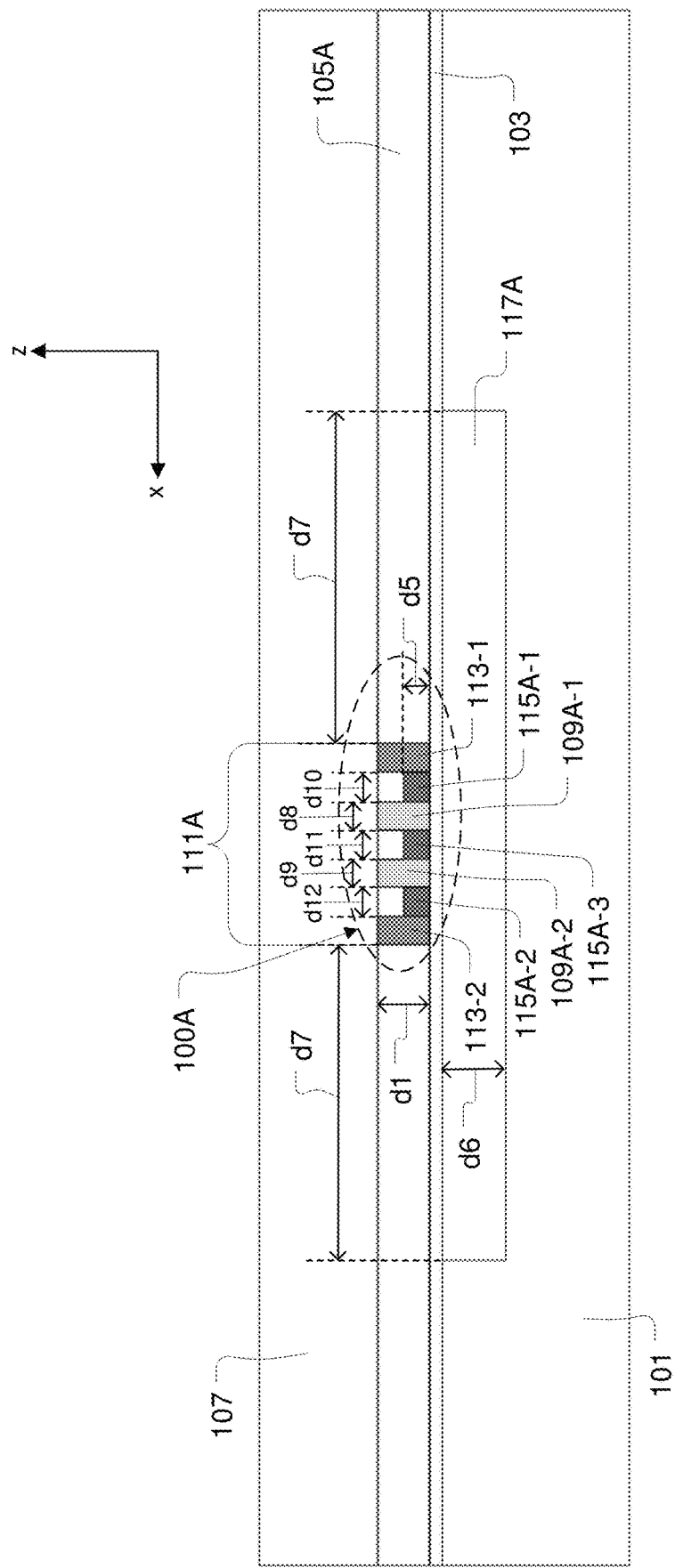
FIG. 3D shows the thermo-optic phase shifter of FIG. 3A within a plane of the vertical cross-section referenced as View A-A in FIG. 3B, in accordance with some embodiments.
Figure 4A:
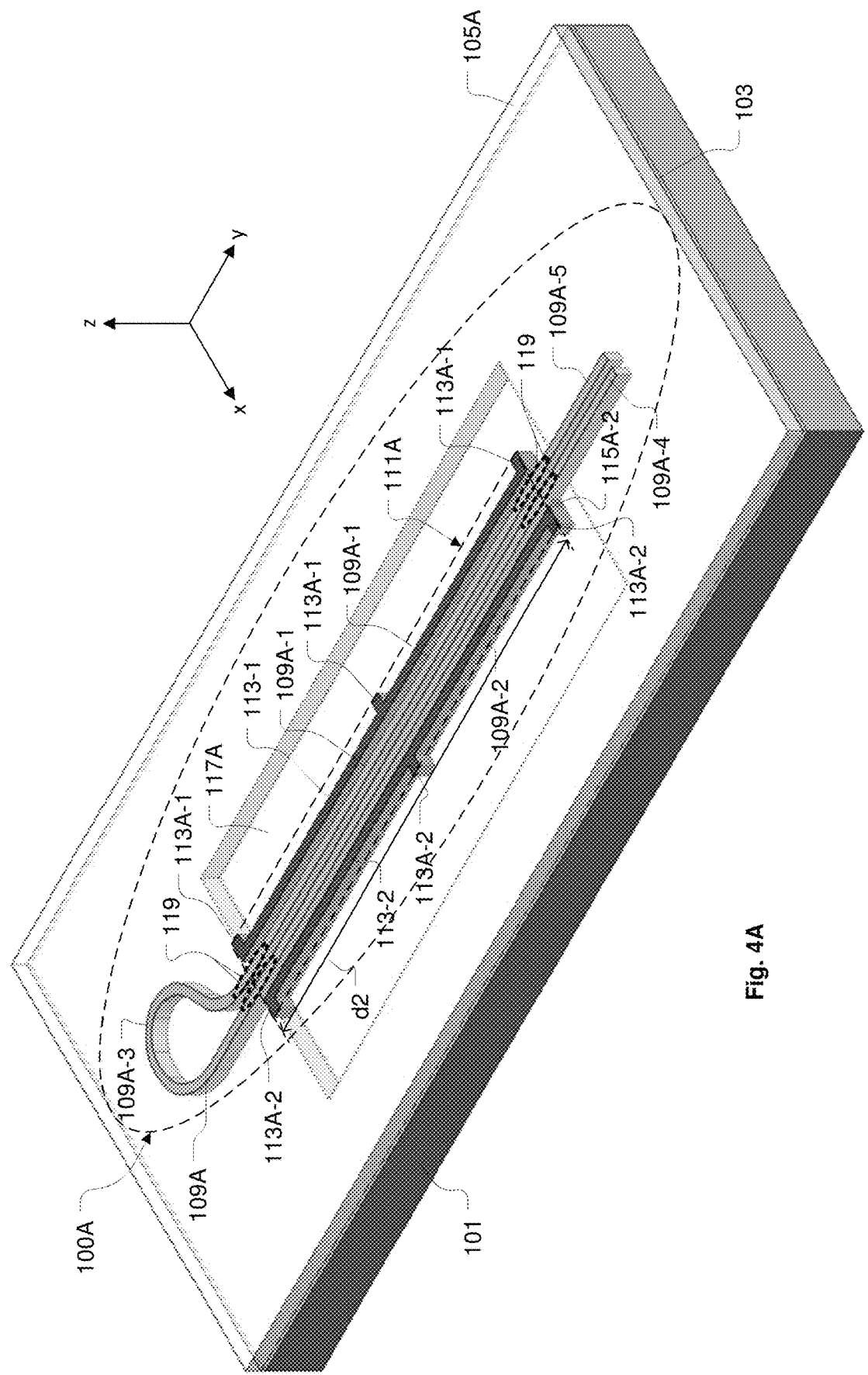
FIG. 4A shows the isometric view of the thermo-optic phase shifter as shown in FIG. 3A with the BEOL region removed to provide a clearer view of the thermo-optic phase shifter, in accordance with some embodiments.
Figure 4B:
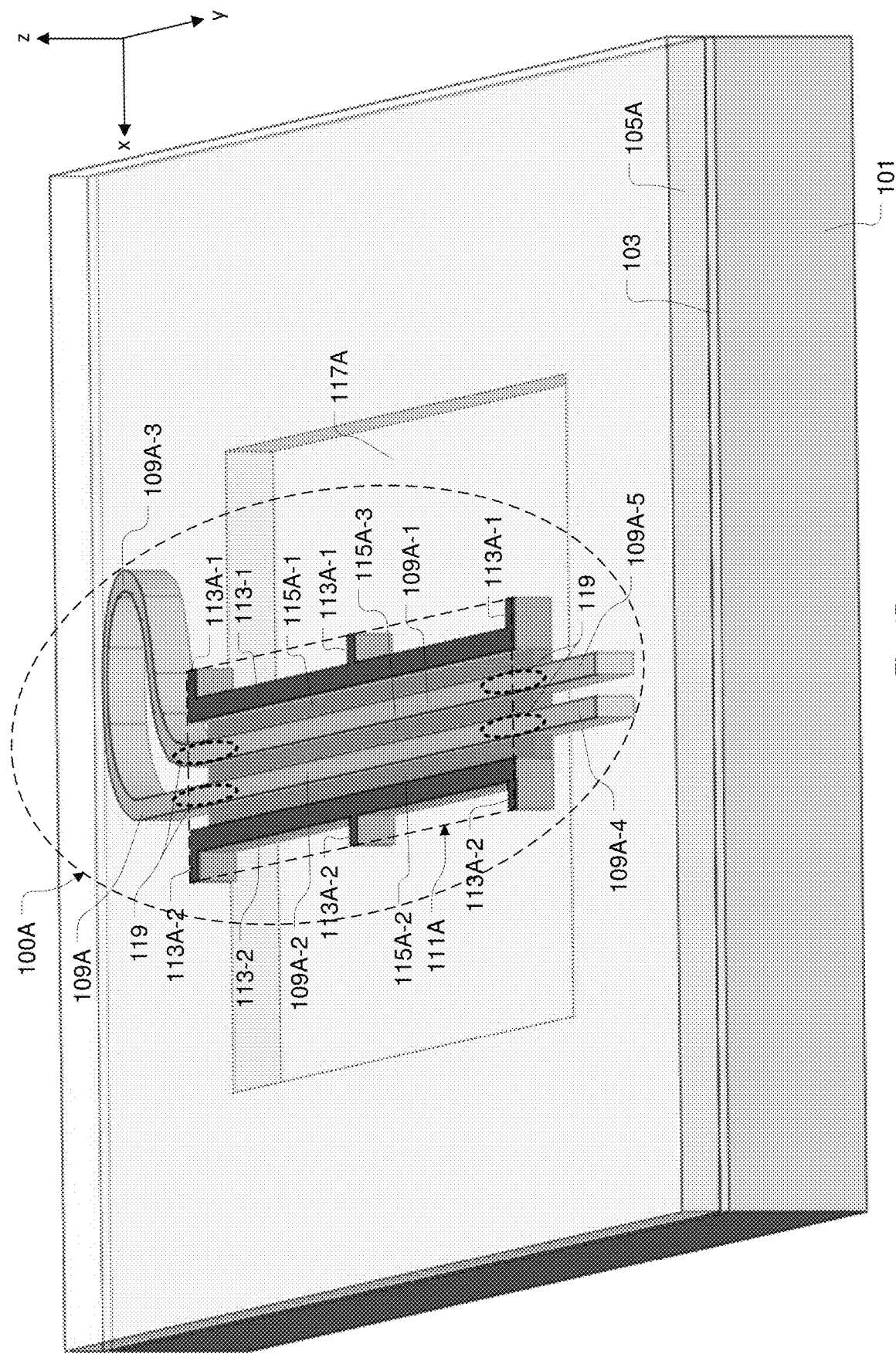
FIG. 4B shows a perspective view of the thermo-optic phase shifter as shown in FIG. 3B with the BEOL region removed to provide a clearer view of the thermo-optic phase shifter, in accordance with some embodiments.

FIG. 3A shows an isometric view of a thermo-optic phase shifter 100A, in accordance with some embodiments. FIG. 3B shows a perspective view of the thermo-optic phase shifter 100A, in accordance with some embodiments. FIG. 3C shows a vertical cross-section through the perspective view of the thermo-optic phase shifter 100A, referenced as View A-A in FIG. 3B, in accordance with some embodiments. FIG. 3D shows the thermo-optic phase shifter 100A within a plane of the vertical cross-section referenced as View A-A in FIG. 3B, in accordance with some embodiments. FIG. 4A shows the isometric view of the thermo-optic phase shifter 100A as shown in FIG. 3A with the BEOL region 107 removed to provide a clearer view of the thermo-optic phase shifter 100A, in accordance with some embodiments. FIG. 4B shows a perspective view of the thermo-optic phase shifter 100A with the BEOL region 107 removed to provide a clearer view of the thermo-optic phase shifter 100A, in accordance with some embodiments.

The thermo-optic phase shifter 100A is a variation of the thermo-optic phase shifter 100 described with regard to FIGS. 1A, 1B, 1C, 1D, 2A, and 2B, which includes the optical waveguide 109 that makes a single pass through the heater region 111. However, as shown in FIG. 3A, the thermo-optic phase shifter 100A includes an optical waveguide 109A configured in a device layer 105A, where the optical waveguide 109A makes two passes through a heater region 111A. In the example thermo-optic phase shifter 100A, the optical waveguide 109A is formed as a continuous structure that includes two segments 109A-1 and 109A-2 within the heater region 111A, a loop-back segment 109A-3, a first input/output segment 109A-4, and a second input/output segment 109A-5.

In some embodiments, the thermo-optic phase shifter 100A includes optical mode converters 119 at the locations where the optical waveguide 109A enters and/or exits the heater region 111A. The optical mode converter 119 is designed to transition the optical mode of the optical waveguide 109A from that of an isolated optical waveguide outside of the heater region 111A to that of an optical waveguide embedded within the surrounding materials of the heater region 111A to ensure that the optical mode along the length of the optical waveguide 109A is suitable for propagation of light through the segments 109A-1 and 109A-2 of the optical waveguide 109A within the heater region 111A. In this manner, the segments 109A-1 and 109A-2 of the optical waveguide 109A within the heater region 111A can have different physical dimensions than the segments 109A-3, 109A-4, and 109A-5 of the optical waveguide 109A outside of the heater region 111A. Also, in some embodiments, the dimensions of the segments 109A-1 and 109A-2 of the optical waveguide 109A can have different physical dimensions relative to each other. In some embodiments, the optical mode converter 119 is configured as part of the optical waveguide 109A itself. More specifically, in some embodiments, the optical mode converter 119 is formed by gradual changes in the geometry of the optical waveguide 109A that enables transition from one optical mode within the optical waveguide 109A to another optical mode within the optical waveguide 109A. For example, in some embodiments, the optical mode converter 119 is configured as a tapering of the width of the optical waveguide 109A over a particular length of the optical waveguide 109A. In some embodiments, the tapered region of the optical waveguide 109A that forms the optical mode converter 119 is substantially symmetric on each lateral side of the optical waveguide 109A.

In various embodiments, use of the optical mode converter(s) 119 is optional and depends upon the dissimilarity between the optical mode of the optical waveguide 109A outside of the heater region 111A and the optical mode of the optical waveguide 109A inside of the heater region 111A. Use of the optical mode converter(s) 119 helps to mitigate undesired light loss and/or light reflection as the light travels through the optical waveguide 109A into and out of the segments 109A-1 and 109A-2 within the heater region 111A. However, in some embodiments, the optical mode of the optical waveguide 109A outside of the heater region 111A and the optical mode within the segments 109A-1 and 109A-2 of the optical waveguide 109A within the heater region 111A are sufficiently similar that use of optical mode converter(s) 119 is not required to achieve acceptable performance of the thermo-optical phase shifter 100A.

The segments 109A-1 and 109A-2 of the optical waveguide 109A have widths d8 and d9, respectively, as measured laterally parallel to the x-y plane as shown in FIG. 3D. In some embodiments, the widths d8 and d9 are substantially equal. However, in some embodiments, one of the widths d8 and d9 is different than the other. The segment 109A-1 of the optical waveguide 109A is separated from the adjacent heater device 113-1 by a distance d10 as measured laterally parallel to the x-y plane. The segments 109A-1 and 109A-2 of the optical waveguide 109A are separated from each other by a distance d11 as measured laterally parallel to the x-y plane. The segment 109A-2 of the optical waveguide 109A is separated from the adjacent heater device 113-2 by a distance d12 as measured laterally parallel to the x-y plane. In some embodiments, the distances d10, d11, and d12 are substantially equal. In some embodiments, one or more of the distances d10, d11, and d12 is/are different than the others.

In some embodiments, the regions between the heater devices 113-1, 113-2 and the optical waveguide 109A are formed of an optical cladding material that provides sufficiently low thermal impedance. However, in some embodiments, the thermo-optic phase shifter 100A includes thermal transmission structures 115A-1, 115A-2 disposed between the heater devices 113-1, 113-2, respectively, and the optical waveguide 109A. The thermal transmission structures 115A-1 and 115A-2 are referred to as outer-positioned thermal transmission structures. Also, in some embodiments, the thermo-optic phase shifter 100A includes a thermal transmission structure 115A-3 disposed between the segments 109A-1 and 109A-2 of the optical waveguide 109A. The thermal transmission structure 115A-3 is referred to as an inner-positioned thermal transmission structure. In some embodiments, the thermal transmission structures 115A-1 and 115A-2 are formed as silicon structures in thermal conduction with both the heater devices 113-1 and 113-2, respectively, and the optical waveguide 109A. Also, in some embodiments, the thermal transmission structure 115A-3 is formed as a silicon structure in thermal conduction with both of the segments 109A-1 and 109A-2 of the optical waveguide 109A. In some embodiments, the thermal transmission structures 115A-1, 115A-2, 115A-3 are formed as thinned silicon structures, relative to the full thickness of the optical waveguide 109A. The thermal transmission structures 115A-1, 115A-2, 115A-3 serve to lower the thermal impedance between the heater devices 113 and the optical waveguide 109A. In some embodiments, the vertical size d5 of the thermal transmission structures 115A-1, 115A-2, 115A-3 is set to keep the optical mode of the optical waveguide 109A sufficiently contained inside the optical waveguide 109A. In some embodiments, the vertical size d5 of the thermal transmission structures 115A-1, 115A-2, 115A-3 is smaller than the vertical size d1 of the optical waveguide 109A. In some embodiments, the vertical size d5 of the thermal transmission structures 115A-1, 115A-2, 115A-3 is within a range extending from a value greater than zero up to about 200 nanometers. In some embodiments, the vertical size d5 of the thermal transmission structures 115A-1, 115A-2, 115A-3 is within a range extending from about 10 nanometers to about 100 nanometers. In some embodiments, the vertical size d5 of the thermal transmission structures 115A-1, 115A-2, 115A-3 is within a range extending from about 30 nanometers to about 80 nanometers. In some embodiments, the thermal transmission structures 115A-1, 115A-2, 115A-3 are formed as thinned portions of a silicon layer that is etched to form the optical waveguide 109A. Configuration of the thermal transmission structures 115A-1, 115A-2, 115A-3 as respective thinned portions of the silicon layer provides for confinement of the optical mode within the optical waveguide 109A.

The cavity 117A is formed within the substrate 101 below the thermo-optic phase shifter 100A. In some embodiments, an undercut etching process is used to form the cavity 117A below the thermo-optic phase shifter 100A. In some embodiments, the undercut etching process is performed after the thermo-optic phase shifter 100A is formed on the substrate 101. In some embodiments, the undercut etching process is performed on the substrate 101 before fabrication of the BEOL layer 107. In some embodiments, the substrate 101 undercut etching process includes formation of an arrangement of openings through both the device layer 105 and BOX layer 103, followed by etching of portions of the substrate 101 through the openings, with the etching of the portions of the substrate 101 undercutting the BOX layer 107 so as to form the cavity 117A as a continuous open region below the thermo-optic phase shifter 100A. A distribution of openings in the arrangement of openings is defined to enable formation of the continuous open region below the thermo-optic phase shifter 100A. For example, in some embodiments, the arrangement of openings is defined in a grid pattern around the heater region 111A of the thermo-optic phase shifter 100A. The openings through which the substrate 101 undercut etching process is performed allow the undercut etchant to reach the substrate 101, e.g., silicon substrate, beneath the light phase shifting region (heater region 111A) of the thermo-optic phase shifter 100A. During undercut etching of the substrate 101, the undercut etchant removes some of the substrate 101 from underneath the thermo-optic phase shifter to form the open cavity 117A that extends in a continuous manner beneath the thermo-optic phase shifter 100A. The openings through which the substrate 101 undercut etching process is performed are sized and spaced apart from each other to ensure that the undercut regions within the substrate 101 that are associated with the various openings merge to form the continuous cavity 117A beneath the thermo-optic phase shifter 100A. An example undercut etching process usable to form the cavity 117A is described in the above-mentioned Barwicz reference. It should be understood, however, that undercut etching processes other than those described in the Barwicz reference can also be used to form the cavity 117A.

The cavity 117A is designed in conjunction with the heater devices 113-1, 113-2 and the optical waveguide 109A to ensure that the thermo-optic phase shifter 100A is fully undercut, such that a specified thickness of the substrate 101 beneath the thermo-optic phase shifter 100A is removed over the substantially entire area underlying the thermo-optic phase shifter 100A, including at the location underlying the middle of the thermo-optic phase shifter structure 100A over which the optical waveguide 109A resides. In some embodiments, the openings through which undercut etching is performed are subsequently sealed. In some embodiments, the cavity 117A is left open, e.g., air-filled or gas-filled. In some embodiments, the cavity 117A is partially or completely back-filled with a backfill material selected to balance thermal impedance, optical performance reliability, and/or manufacturability, among other factors. In some embodiments, rather forming the cavity 117A by doing the undercut etch through openings formed through the device layer 105 and BOX layer 103, the cavity 117A or equivalent region is formed by doing a partial substrate 101 removal process (patterned removal of substrate 101 material) from the underside of the substrate 101.

In some embodiments, the geometries of the heater devices 113-1, 113-2, the optical waveguide 109A, and the openings for the undercut etching process are configured to enable fabrication of the cavity 117A below the thermo-optic phase shifter 100A, while minimizing optical losses, scattering, reflections, and/or other impairments to the optical signal that is to be transmitted through the optical waveguide 109A, and while also preventing mechanical failures within the structure of the thermo-optic phase shifter 100A. The cavity 117A increases the thermal impedance between the thermo-optic phase shifter 100A and the surrounding material(s), which allows more efficient operation of the thermo-optic phase shifter 100A by reducing heat transfer to the surrounding material(s). In some embodiments, the depth d6 of the cavity 117A is within a range extending from about 1 micrometer to about 50 micrometers. In some embodiments, the depth d6 of the cavity 117A is within a range extending from about 5 micrometers to about 20 micrometers. In some embodiments, the depth d6 of the cavity 117A is within a range extending from about 8 micrometers to about 15 micrometers. In some embodiments, the depth d6 of the cavity 117A is dependent upon the technology used for fabrication and the undercut etching process used to form the cavity 117A. A larger depth d6 of the cavity 117A provides better thermal efficiency of the thermo-optic phase shifter 100A. However, beyond an effective depth d6 of the cavity 117A, the improvement in thermal efficiency of the thermo-optic phase shifter 100A is inconsequential. Also, the depth d6 of the cavity 117A is defined to ensure that the mechanical integrity of the overall structure of the thermo-optic phase shifter 100A is not compromised. The cavity 117A is designed to extend far enough laterally from the thermo-optic phase shifter 100A to achieve sufficient thermal isolation between the thermo-optic phase shifter 100A and neighboring features/components. In some embodiments, the lateral extension d7 of the cavity 117A beyond the heater devices 113 is within a range extending from about 1 micrometer to about 100 micrometers. In some embodiments, the lateral extension d7 of the cavity 117A beyond the heater devices 113 is within a range extending from about 5 micrometers to about 50 micrometers. In some embodiments, the lateral extension d7 of the cavity 117A beyond the heater devices 113 is within a range extending from about 10 micrometers to about 30 micrometers. The thermal isolation of the thermo-optic phase shifter 100A increases as the lateral extension d7 of the cavity 117A increases. Therefore, as the lateral extension d7 of the cavity 117A increases, the thermal tuning efficiency of the thermo-optic phase shifter 100A increases. However, beyond an effective lateral extension d7 of the cavity 117A, the improvement in thermal tuning efficiency of the thermo-optic phase shifter 100A is inconsequential. Also, the lateral extension d7 of the cavity 117A is defined to ensure the mechanical integrity of the overall structure of the thermo-optic phase shifter 100A. The cavity 117A functions as a thermal insulator to help retain thermal energy within the thermo-optic phase shifter 100A, which in turn improves the precision of temperature control of the optical waveguide 109A, reduces an amount energy required by the heater devices 113-1, 113-2 to reach and maintain a prescribed temperature of the optical waveguide 109A, and helps mitigate thermal transfer to electrical devices and/or optical devices that are formed near the thermo-optic phase shifter 100A within the device layer 105A.

In the thermo-optic phase shifter 100A, the segments 109A-1 and 109A-2 of the optical waveguide 109A are positioned between the two heater devices 113-1, 113-2. The loop-back segment 109A-3 optical waveguide 109A outside of the heater region 111A connects the segments 109A-1 and 109A-2 of the optical waveguide 109A inside the heater region 111A in a continuous path, such that light injected into the first input/output segment 109A-4 of the optical waveguide 109A will make two passes through the heater region 111A and exit from the second input/output segment 109A-5 of the optical waveguide 109A, and such that light injected into the second input/output segment 109A-5 of the optical waveguide 109A will make two passes through the heater region 111A and exit from the first input/output segment 109A-4 of the optical waveguide 109A. The loop-back segment 109A-3 of the optical waveguide 109A is sized so that an overall size of the thermo-optic phase shifter 100A is compact but still large enough to minimize the optical energy that is lost to bend transitions and optical radiation modes within the optical waveguide 109A.

Because the optical waveguide 109A makes two passes through the heater region 111A, the heater devices 113-1, 113-2 are able to affect a temperature change in the two segments 109A-1 and 109A-2 of the optical waveguide 109A within the heater region 111A, which provides for a greater phase shift of the light traveling through the optical waveguide 109A for the same amount of electrical power supplied to the heater devices 113-1, 113-2. The two segments 109A-1 and 109A-2 of the optical waveguide 109A that pass through the heater region 111A are spaced apart from each other such that optical coupling between optical modes in the two segments 109A-1 and 109A-2 of the optical waveguide 109A is insignificant with respect to overall performance of the thermo-optic phase shifter 100A. In some embodiments, to improve tradeoffs between compactness of the thermo-optic phase shifter 100A and minimizing/preventing optical coupling between the adjacently positioned segments 109A-1 and 109A-2 of the optical waveguide 109A within the heater region 111A, the two segments 109A-1 and 109A-2 of the optical waveguide 109A are sized slightly different from each other so that optical overlap between the two segments 109A-1 and 109A-2 of the optical waveguide 109A is not phase-matched. In some embodiments, the two segments 109A-1 and 109A-2 of the optical waveguide 109A within the heater region 111A are configured to have different widths d8 and d9, respectively, so that optical overlap between the two segments 109A-1 and 109A-2 of the optical waveguide 109A within the heater region 111A is not phase-matched.

Figure 5A:
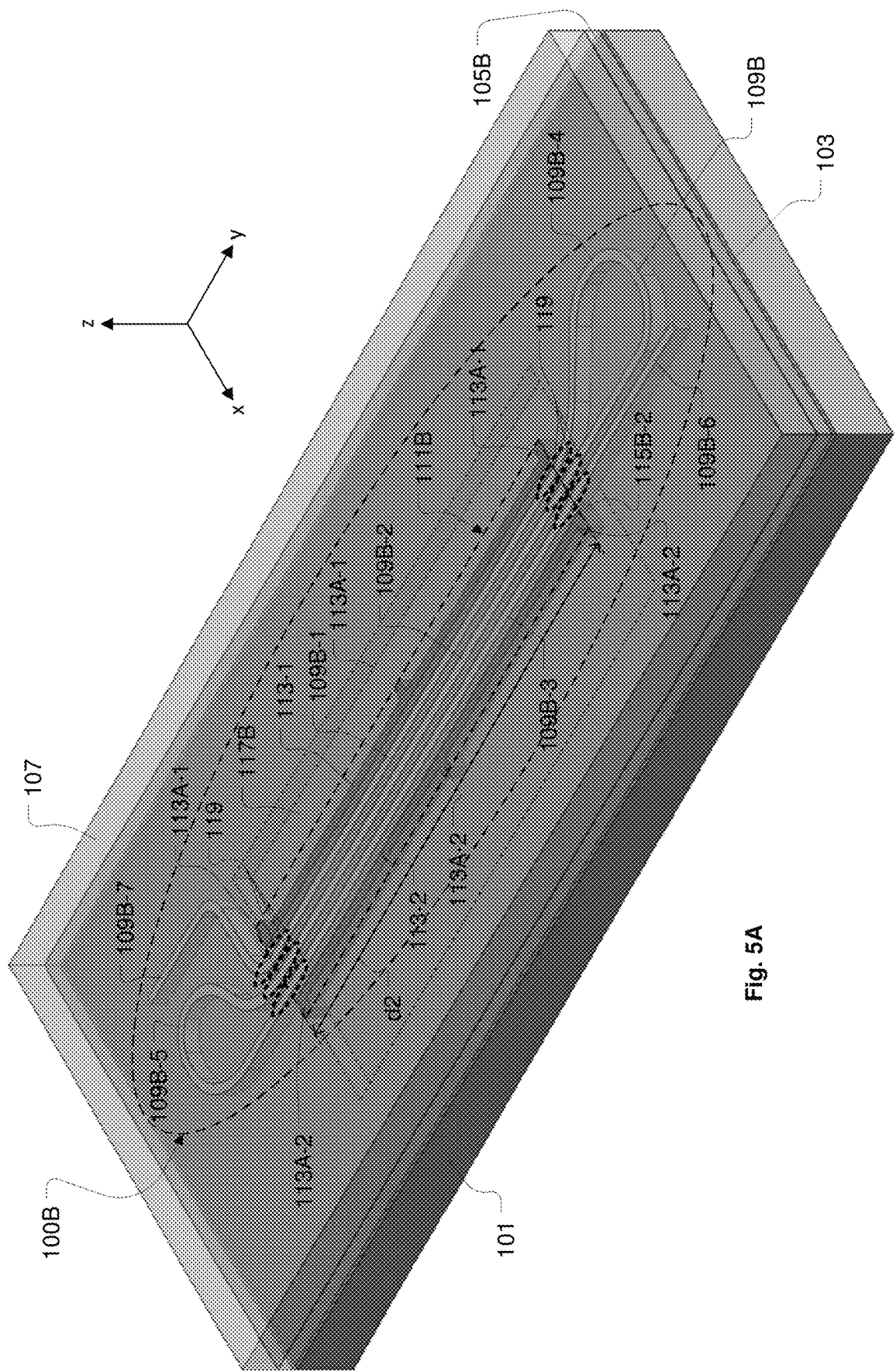
FIG. 5A shows an isometric view of a thermo-optic phase shifter, in accordance with some embodiments.
Figure 5B:
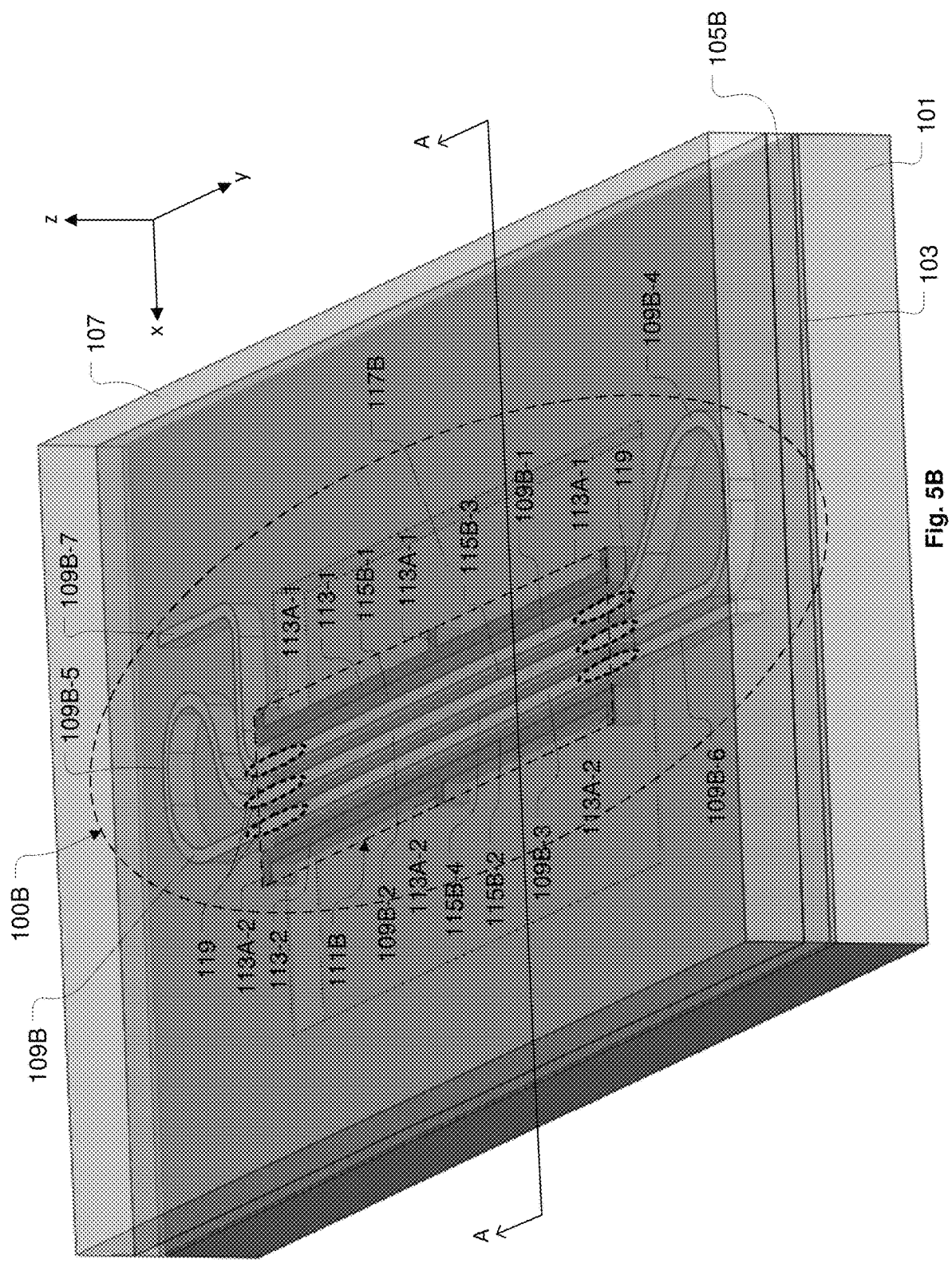
FIG. 5B shows a perspective view of the thermo-optic phase shifter of FIG. 5A, in accordance with some embodiments.
Figure 5C:
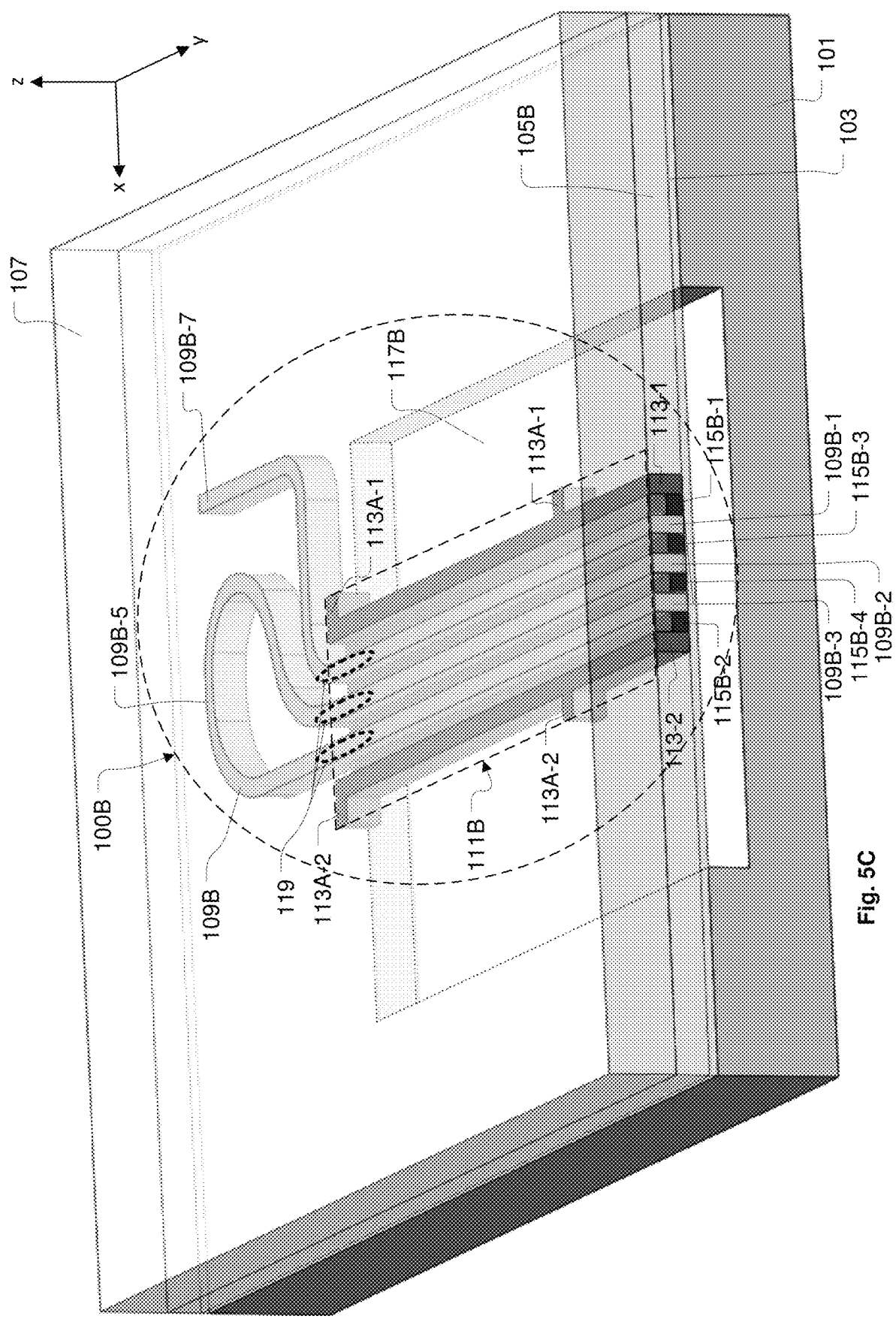
FIG. 5C shows a vertical cross-section through the perspective view of the thermo-optic phase shifter, referenced as View A-A in FIG. 5B, in accordance with some embodiments.
Figure 5D:
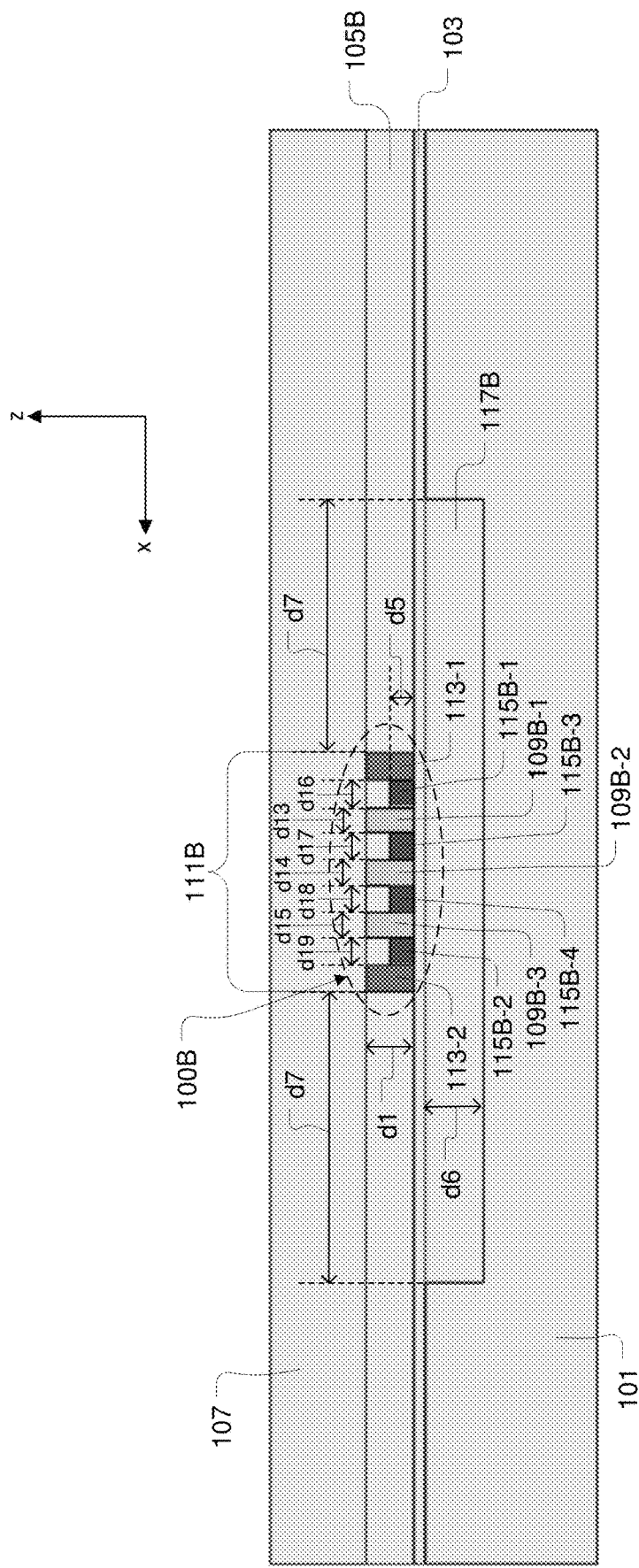
FIG. 5D shows the thermo-optic phase shifter as shown in FIG. 5A within a plane of the vertical cross-section referenced as View A-A in FIG. 5B, in accordance with some embodiments.
Figure 6A:
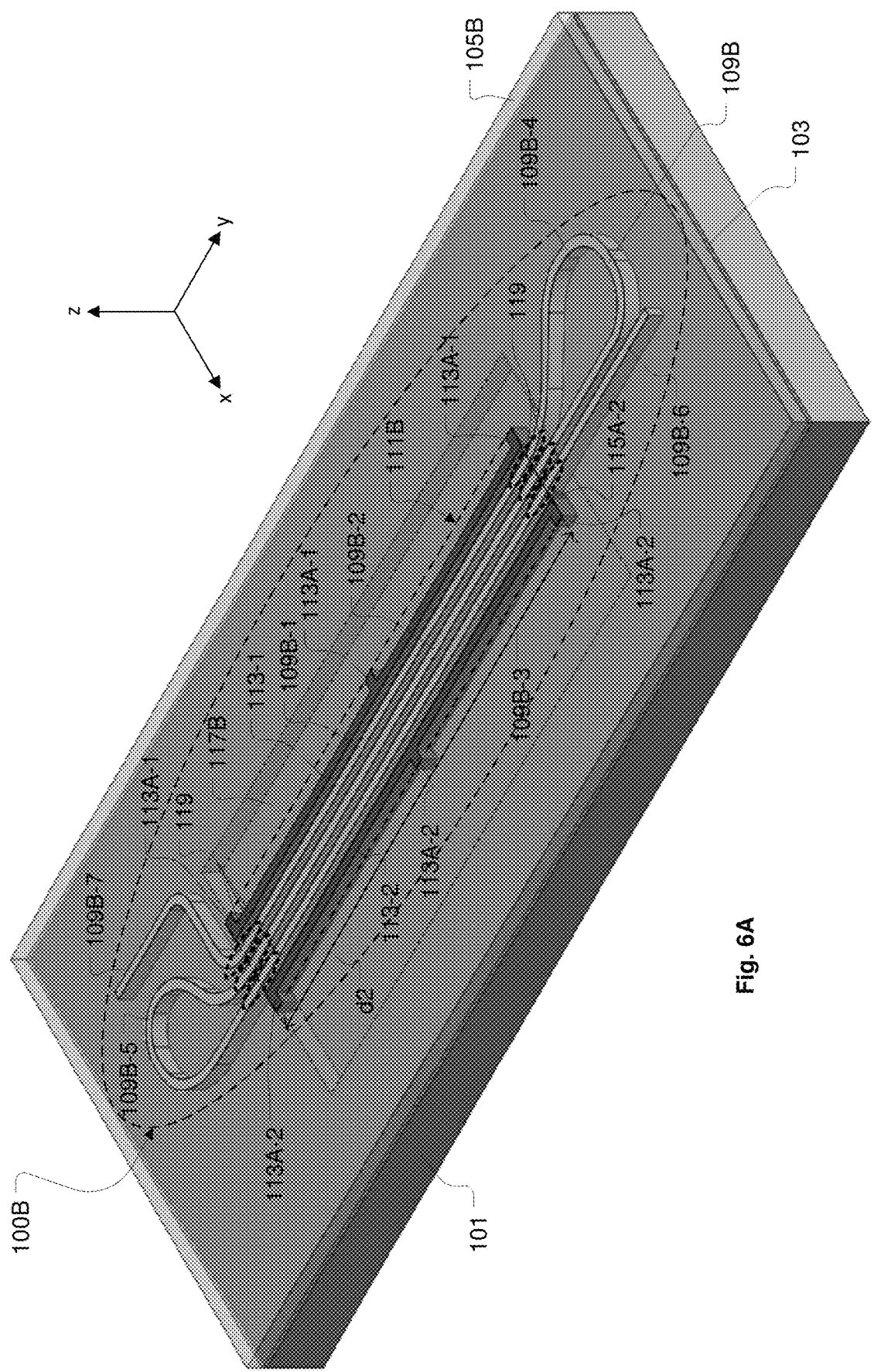
FIG. 6A shows the isometric view of the thermo-optic phase shifter as shown in FIG. 5A with the BEOL region removed to provide a clearer view of the thermo-optic phase shifter, in accordance with some embodiments.

FIG. 5A shows an isometric view of a thermo-optic phase shifter 100B, in accordance with some embodiments. FIG. 5B shows a perspective view of the thermo-optic phase shifter 100B, in accordance with some embodiments. FIG. 5C shows a vertical cross-section through the perspective view of the thermo-optic phase shifter 100B, referenced as View A-A in FIG. 5B, in accordance with some embodiments. FIG. 5D shows the thermo-optic phase shifter 100B within a plane of the vertical cross-section referenced as View A-A in FIG. 5B, in accordance with some embodiments. FIG. 6A shows the isometric view of the thermo-optic phase shifter 100B as shown in FIG. 5A with the BEOL region 107 removed to provide a clearer view of the thermo-optic phase shifter 100B, in accordance with some embodiments. FIG. 6B shows a perspective view of the thermo-optic phase shifter 100B with the BEOL region 107 removed to provide a clearer view of the thermo-optic phase shifter 100B, in accordance with some embodiments.

The thermo-optic phase shifter 100B is a variation of the thermo-optic phase shifter 100 described with regard to FIGS. 1A, 1B, 1C, 1D, 2A, and 2B, which includes the optical waveguide 109 that makes a single pass through the heater region 111. However, as shown in FIG. 5A, the thermo-optic phase shifter 100B includes an optical waveguide 109B configured in a device layer 105B, where the optical waveguide 109B makes three passes through a heater region 111B. In the example thermo-optic phase shifter 100B, the optical waveguide 109B is formed as a continuous structure that includes three segments 109B-1, 109B-2, and 109B-3 within the heater region 111B, a first loop-back segment 109B-4, a second loop-back segment 109B-5, a first input/output segment 109B-6, and a second input/output segment 109B-7.

In some embodiments, the thermo-optic phase shifter 100B includes optical mode converters 119 at the locations where the optical waveguide 109B enters and/or exits the heater region 111B. The optical mode converter 119 is designed to transition the optical mode of the optical waveguide 109B from that of an isolated optical waveguide outside of the heater region 111B to that of an optical waveguide embedded within the surrounding materials of the heater region 111B to ensure that the optical mode along the length of the optical waveguide 109B is suitable for propagation of light through the segments 109B-1, 109B-2, and 109B-3 of the optical waveguide 109B within the heater region 111B. In this manner, the segments 109B-1, 109B-2, and 109B-3 of the optical waveguide 109B within the heater region 111B can have different physical dimensions than the segments 109B-4, 109B-5, 109B-6, and 109B-7 of the optical waveguide 109B outside of the heater region 111B. Also, in some embodiments, the dimensions of the segments 109B-1, 109B-2, and 109B-3 of the optical waveguide 109B can have different physical dimensions relative to each other. In some embodiments, the optical mode converter 119 is configured as part of the optical waveguide 109B itself. More specifically, in some embodiments, the optical mode converter 119 is formed by gradual changes in the geometry of the optical waveguide 109B that enables transition from one optical mode within the optical waveguide 109B to another optical mode within the optical waveguide 109B. For example, in some embodiments, the optical mode converter 119 is formed by tapering the width of the optical waveguide 109B (as measured parallel to the x-y plane) along a specified length of the optical waveguide 109B. Also, in some embodiments, the tapered region of the optical waveguide 109B that forms the optical mode converter 119 is substantially symmetric on each lateral side of the optical waveguide 109B.

In various embodiments, use of the optical mode converter(s) 119 is optional and depends upon the dissimilarity between the optical mode of the optical waveguide 109B outside of the heater region 111B and the optical mode of the optical waveguide 109B inside of the heater region 111B. Use of the optical mode converter(s) 119 helps to mitigate undesired light loss and/or light reflection as the light travels through the optical waveguide 109B into and out of the segments 109B-1, 109B-2, and 109B-3 within the heater region 111B. However, in some embodiments, the optical mode of the optical waveguide 109B outside of the heater region 111B and the optical mode of the segments 109B-1, 109B-2, and 109B-3 of the optical waveguide 109B within the heater region 111B are sufficiently similar that use of optical mode converter(s) 119 is not required to achieve acceptable performance of the thermo-optical phase shifter 100B.

The segments 109B-1, 109B-2, and 109B-3 of the optical waveguide 109B have widths d13, d14, and d15, respectively, as measured in the lateral direction parallel to the x-y plane, as shown in FIG. 5D. In some embodiments, the widths d13, d14, and d15 are substantially equal. However, in some embodiments, one or more of the widths d13, d14, and d15 is/are different than the others. The segment 109B-1 of the optical waveguide 109B is separated from the adjacent heater device 113-1 by a distance d16 as measured in the lateral direction parallel to the x-y plane. The segments 109B-1 and 109B-2 of the optical waveguide 109B are separated from each other by a distance d17 as measured in the lateral direction parallel to the x-y plane. The segments 109B-2 and 109B-3 of the optical waveguide 109B are separated from each other by a distance d18 as measured in the lateral direction parallel to the x-y plane. The segment 109B-3 of the optical waveguide 109B is separated from the adjacent heater device 113-2 by a distance d19 as measured in the lateral direction parallel to the x-y plane. In some embodiments, the distances d17 and d18 are substantially equal. In some embodiments, the distances d16, d17, d18, and d19 are substantially equal. In some embodiments, one or more of the distances d16, d17, d18, and d19 is/are different than the others.

In some embodiments, the region between the heater devices 113-1, 113-2 and the optical waveguide 109B is formed of cladding material that provides sufficiently low thermal impedance. However, in some embodiments, the thermo-optic phase shifter 100B includes thermal transmission structures 115B-1 and 115B-2 disposed between the heater devices 113-1 and 113-2, respectively, and the optical waveguide 109B. The thermal transmission structures 115B-1 and 115B-2 are referred to as outer-positioned thermal transmission structures. Also, in some embodiments, the thermo-optic phase shifter 100B includes a thermal transmission structure 115B-3 disposed between the segments 109B-1 and 109B-3 of the optical waveguide 109B. Also, in some embodiments, the thermo-optic phase shifter 100B includes a thermal transmission structure 115B-4 disposed between the segments 109B-2 and 109B-4 of the optical waveguide 109B. The thermal transmission structures 115B-3 and 115B-4 are referred to as inner-positioned thermal transmission structures. In some embodiments, the thermal transmission structure 115B-1 is formed as a silicon structure in thermal conduction with both the heater device 113-1 and the segment 109B-1 of the optical waveguide 109B. In some embodiments, the thermal transmission structure 115B-2 is formed as a silicon structure in thermal conduction with both the heater device 113-2 and the segment 109B-3 of the optical waveguide 109B. In some embodiments, the thermal transmission structure 115B-3 is formed as a silicon structure in thermal conduction with both of the segments 109B-1 and 109B-2 of the optical waveguide 109B. In some embodiments, the thermal transmission structure 115B-4 is formed as a silicon structure in thermal conduction with both of the segments 109B-2 and 109B-3 of the optical waveguide 109B. In some embodiments, the thermal transmission structures 115B-1, 115B-2, 115B-3, 115B-4 are formed as thinned portions of a silicon layer from which the optical waveguide 109B is formed. In these embodiments, formation of the thermal transmission structures 115B-1, 115B-2, 115B-3, 115B-4 as respective thinned portions of the silicon layer provides for confinement of the optical mode within the optical waveguide 109B.

The thermal transmission structures 115B-1 and 115B-2 serve to lower the thermal impedance between the heater devices 113-1 and 113-2, respectively, and the optical waveguide 109B. In some embodiments, the vertical size d5 of the thermal transmission structures 115B-1, 115B-2, 115B-3, 115B-4 is set to keep the optical mode sufficiently contained inside the optical waveguide 109B. In some embodiments, the vertical size d5 of the thermal transmission structures 115B-1, 115B-2, 115B-3, 115B-4 is smaller than the vertical size d1 of the optical waveguide 109B. In some embodiments, the vertical size d5 of the thermal transmission structures 115B-1, 115B-2, 115B-3, 115B-4 is within a range extending from a value greater than zero up to about 200 nanometers. In some embodiments, the vertical size d5 of the thermal transmission structures 115B-1, 115B-2, 115B-3, 115B-4 is within a range extending from about 10 nanometers to about 100 nanometers. In some embodiments, the vertical size d5 of the thermal transmission structures 115B-1, 115B-2, 115B-3, 115B-4 is within a range extending from about 30 nanometers to about 80 nanometers.

The cavity 117B is formed within the substrate 101 below the thermo-optic phase shifter 100B. In some embodiments, an undercut etching process is used to form the cavity 117B below the thermo-optic phase shifter 100B. In some embodiments, the undercut etching process is performed after the thermo-optic phase shifter 100B is formed on the substrate 101. In some embodiments, the undercut etching process is performed on the substrate 101 before fabrication of the BEOL layer 107. In some embodiments, the undercut etching process includes formation of an arrangement of openings through both the device layer 105 and BOX layer 103, followed by etching of portions of the substrate 101 through the arrangement of openings, with the etching of the portions of the substrate 101 undercutting the BOX layer 107 so as to form the cavity 117B as a continuous open region below the thermo-optic phase shifter 100B. A distribution of the openings in the arrangement of openings is defined to enable formation of the continuous open region below the thermo-optic phase shifter 100B. For example, in some embodiments, the arrangement of openings is formed in a grid pattern around the thermo-optic phase shifter 100B. The openings through which the substrate 101 undercut etching process is performed are sized and spaced apart from each other to ensure that the undercut regions within the substrate 101 that are associated with the various openings merge to form the continuous cavity 117B beneath the thermo-optic phase shifter 100B. The openings allow the undercut etchant to reach the substrate 101, e.g., silicon substrate, beneath the light phase shifting region (heater region 111B) of the thermo-optic phase shifter 100B, so as to remove some of the substrate 101 from underneath the thermo-optic phase shifter 100B to form the open cavity 117B that extends in a continuous manner beneath the thermo-optic phase shifter 100B. An example substrate 101 undercut etching process usable to form the cavity 117B is described in the above-mentioned Barwicz reference. It should be understood, however, that undercut etching processes other than those described in the Barwicz reference can also be used to form the cavity 117B.

The cavity 117B is designed in conjunction with the heater devices 113-1, 113-2 and the optical waveguide 109B to ensure that the thermo-optic phase shifter 100B is fully undercut, such that a specified thickness of the substrate 101 beneath the thermo-optic phase shifter 100B is removed over substantially the entire area underlying the thermo-optic phase shifter 100B, including at the location underlying the middle of the thermo-optic phase shifter structure 100B over which the optical waveguide 109B resides. In some embodiments, the openings through which the substrate 101 undercut etching process is performed are subsequently sealed. In some embodiments, the cavity 117B is left open, e.g., air-filled or gas-filled. In some embodiments, the cavity 117B is partially or completely back-filled with a backfill material selected to balance thermal impedance, optical performance reliability, and/or manufacturability, among other factors. In some embodiments, rather than forming the cavity 117B by doing the substrate 101 undercut etching process through openings formed through the device layer 105 and BOX layer 103, the cavity 117B is formed by doing a partial substrate 101 removal process (patterned removal of substrate 101 material) from the exposed underside of the substrate 101.

In some embodiments, the geometries of the heater devices 113-1, 113-2, the optical waveguide 109B, and the openings for the substrate 101 undercut etching process are configured to enable fabrication of the cavity 117B below the thermo-optic phase shifter 100B, while minimizing optical losses, scattering, reflections, and/or other impairments to the optical signal that is to be transmitted through the optical waveguide 109B, and while also preventing mechanical failures within the structure of the thermo-optic phase shifter 100B. The cavity 117B increases the thermal impedance between the thermo-optic phase shifter 100B and the surrounding material(s), which allows more efficient operation of the thermo-optic phase shifter 100B by reducing heat transfer to the surrounding material(s). In some embodiments, the depth d6 of the cavity 117B is within a range extending from about 1 micrometer to about 50 micrometers. In some embodiments, the depth d6 of the cavity 117B is within a range extending from about 5 micrometers to about 20 micrometers. In some embodiments, the depth d6 of the cavity 117B is within a range extending from about 8 micrometers to about 15 micrometers. In some embodiments, the depth d6 of the cavity 117B is dependent upon the technology used for fabrication and the undercut etching process used to form the cavity 117B. A larger depth d6 of the cavity 117B provides better thermal efficiency of the thermo-optic phase shifter 100B. However, beyond an effective depth d6 of the cavity 117B, the improvement in thermal efficiency of the thermo-optic phase shifter 100B is inconsequential. Also, the depth d6 of the cavity 117B is defined to ensure the mechanical integrity of the overall structure of the thermo-optic phase shifter 100B. The cavity 117B is designed to extend far enough in the lateral direction parallel to the x-y plane from the thermo-optic phase shifter 100B to achieve sufficient thermal isolation between the thermo-optic phase shifter 100B and neighboring features/components within the device layer 105B. In some embodiments, the lateral extension d7 of the cavity 117B beyond the heater devices 113 is within a range extending from about 1 micrometer to about 100 micrometers. In some embodiments, the lateral extension d7 of the cavity 117B beyond the heater devices 113 is within a range extending from about 5 micrometers to about 50 micrometers. In some embodiments, the lateral extension d7 of the cavity 117B beyond the heater devices 113 is within a range extending from about 10 micrometers to about 30 micrometers. The thermal isolation of the thermo-optic phase shifter 100B increases as the lateral extension d7 of the cavity 117B increases. Therefore, as the lateral extension d7 of the cavity 117B increases, the thermal tuning efficiency of the thermo-optic phase shifter 100B increases. However, beyond an effective lateral extension d7 of the cavity 117B, the improvement in thermal tuning efficiency of the thermo-optic phase shifter 100B is inconsequential. Also, the lateral extension d7 of the cavity 117B is defined to ensure the mechanical integrity of the overall structure of the thermo-optic phase shifter 100B. The cavity 117B functions as a thermal insulator to help retain thermal energy within the thermo-optic phase shifter 100B, which in turn improves the precision of temperature control of the optical waveguide 109B, reduces an amount energy required by the heater devices 113-1, 113-2 to reach and maintain a prescribed temperature of the optical waveguide 109B, and helps mitigate thermal transfer to electrical devices and/or optical devices that are formed near the thermo-optic phase shifter 100B within the device layer 105B.

In the thermo-optic phase shifter 100B, the multiple segments 109B-1, 109B-2, and 109B-3 of the optical waveguide 109B are positioned between the two heater devices 113-1 and 113-2. The first loop-back segment 109B-4 and the second loop-back segment 109B-5 of the optical waveguide 109B outside of the heater region 111B connect the multiple segments 109B-1, 109B-2, and 109B-3 of the optical waveguide 109B inside the heater region 111B in a serpentine continuous path, such that light injected into the first input/output segment 109B-6 of the optical waveguide 109B will make multiple passes through the heater region 111B and exit from the second input/output segment 109B-7 of the optical waveguide 109B, and such that light injected into the second input/output segment 109B-7 of the optical waveguide 109B will make multiple passes through the heater region 111B and exit from the first input/output segment 109B-6 of the optical waveguide 109B. The first loop-back segment 109B-4 and the second loop-back segment 109B-5 of the optical waveguide 109B are sized so that an overall size of the thermo-optic phase shifter 100B is compact but still large enough to minimize the optical energy that is lost to bend transitions and optical radiation modes within the optical waveguide 109B.

Because the optical waveguide 109B makes multiple passes through the heater region 111B, the heater devices 113-1 and 113-2 are able to affect a temperature change in the multiple segments 109B-1, 109B-2, and 109B-3 of the optical waveguide 109B that pass through the heater region 111B, which provides for a greater phase shift of the light traveling through the optical waveguide 109B for the same amount of electrical power supplied to the heater devices 113-1 and 113-2. The multiple segments 109B-1, 109B-2, and 109B-3 of the optical waveguide 109B that pass through the heater region 111B are spaced such that optical coupling between optical modes in adjacent segments 109B-1, 109B-2, and 109B-3 of the optical waveguide 109B is insignificant with respect to overall performance of the thermo-optic phase shifter 100B. In some embodiments, to improve tradeoffs between compactness of the thermo-optic phase shifter 100B and minimizing/preventing optical coupling between adjacent segments 109B-1, 109B-2, and 109B-3 of the optical waveguide 109B within the heater region 111B, the different segments 109B-1, 109B-2, and 109B-3 of the optical waveguide 109B are sized slightly different from each other so that optical overlap between the different segments 109B-1, 109B-2, and 109B-3 of the optical waveguide 109B is/are not phase-matched. In some embodiments, adjacent segments 109B-1, 109B-2, and 109B-3 of the optical waveguide 109B within the heater region 111B are configured to have different widths d13, d14, and d15 so that optical overlap between the different segments 109B-1, 109B-2, and 109B-3 of the optical waveguide 109B within the heater region 111B is/are not phase-matched. It should be understood that the principles described above with regard to the thermo-optic phase shifters 100A and 100B can be applied to form a thermo-optic phase shifter that includes four or more passes of an optical waveguide through a heater region, where the thermo-optic phase shifter overlies a cavity formed in an underlying substrate.

In some embodiments, the thermo-optic phase shifter 100, 100A, 100B is disclosed to include the substrate 101 having the cavity 117, 117A, 117B formed into an upper region of the substrate 101. The thermo-optic phase shifter 100, 100A, 100B includes the optical waveguide 109, 109A, 109B disposed above the substrate 101. The optical waveguide 109, 109A, 109B extends across and above the cavity 117, 117A, 117B. The thermo-optic phase shifter 100, 100A, 100B also includes one or more of the heater devices 113-1 and 113-2 disposed along a respective lateral side of the optical waveguide 109, 109A, 109B. Each of the heater devices 113-1 and 113-2 extends across and above the cavity 117, 117A, 117B. In some embodiments, the segment of the optical waveguide 109, 109A, 109B that extends across and above the cavity 117, 117A, 117B has a substantially linear shape. In some embodiments, each of the heater devices 113-1 and 113-2 has a substantially linear shape along a lateral side of the heater device 113-1, 113-2 closest to the lateral side of the optical waveguide 109, 109A, 109B. Also, in some embodiments, the linear-shaped lateral side of the heater device 113-1, 113-2 is oriented substantially parallel to the lateral side of the optical waveguide 109, 109A, 109B. In some embodiments, the heater device 113-1, 113-2 includes a plurality of heater device segments, where each heater device segment extends between an adjacently positioned pair of contact portions 113A-1, 113A-2 of the heater device 113-1, 113-2. Each adjacently positioned pair of contact portions 113A-1, 113A-2 within a given one of the heater device 113-1, 113-2 includes one contact portion 113A-1, 113A-2 electrically connected to a first electrical potential and one contact portion 113A-1, 113A-2 electrically connected to a second electrical potential, where either the first electrical potential is greater than the second electrical potential, or the second electrical potential is greater than the first electrical potential, such that an electrical current will flow between the adjacently positioned pair of contact portions 113A-1, 113A-2.

In some embodiments, the thermo-optic phase shifter 100, 100A, 100B includes a thermal transmission structure 115-1, 115-2, 115A-1, 115A-2, 115B-1, 115B-2 disposed between the lateral side of the optical waveguide 109, 109A, 109B and a lateral side of the heater device 113-1, 113-2 closest to the lateral side of the optical waveguide 109, 109A, 109B. The thermal transmission structures 115-1, 115-2, 115A-1, 115A-2, 115A-3, 115B-1, 115B-2, 115B-3, 115B-4 extend across and above the cavity 117, 117A, 117B. In some embodiments, the vertical size d5 of the thermal transmission structure 115-1, 115-2, 115A-1, 115A-2, 115A-3, 115B-1, 115B-2, 115B-3, 115B-4 is less than the vertical size d1 of the optical waveguide 109, 109A, 109B to avoid optical coupling between a primary optical mode of the optical waveguide 109, 109A, 109B and the thermal transmission structure 115-1, 115-2, 115A-1, 115A-2, 115A-3, 115B-1, 115B-2, 115B-3, 115B-4.

In some embodiments, the optical waveguide 109, 109A, 109B, the heater device(s) 113-1, 113-2, and the thermal transmission structure(s) 115-1, 115-2, 115A-1, 115A-2, 115A-3, 115B-1, 115B-2, 115B-3, 115B-4 are located within the device layer 105 of a semiconductor chip. In some embodiments, the BEOL region 107 of the semiconductor chip is located above the device layer 105. Also, in some embodiments, the BOX layer 103 is disposed between the substrate 101 and the device layer 105. The BOX layer 103 extends over the cavity 117, 117A, 117B and below each of the optical waveguide 109, 109A, 109B, the heater device(s) 113-1, 113-2, and the thermal transmission structure(s) 115-1, 115-2, 115A-1, 115A-2, 115A-3, 115B-1, 115B-2, 115B-3, 115B-4. Also, in some embodiments, the optical waveguide 109, 109A, 109B includes an optical mode converter 119 at each location where the optical waveguide 109, 109A, 109B enters or exits a region above the cavity 117, 117A, 117B.

Figure 7:
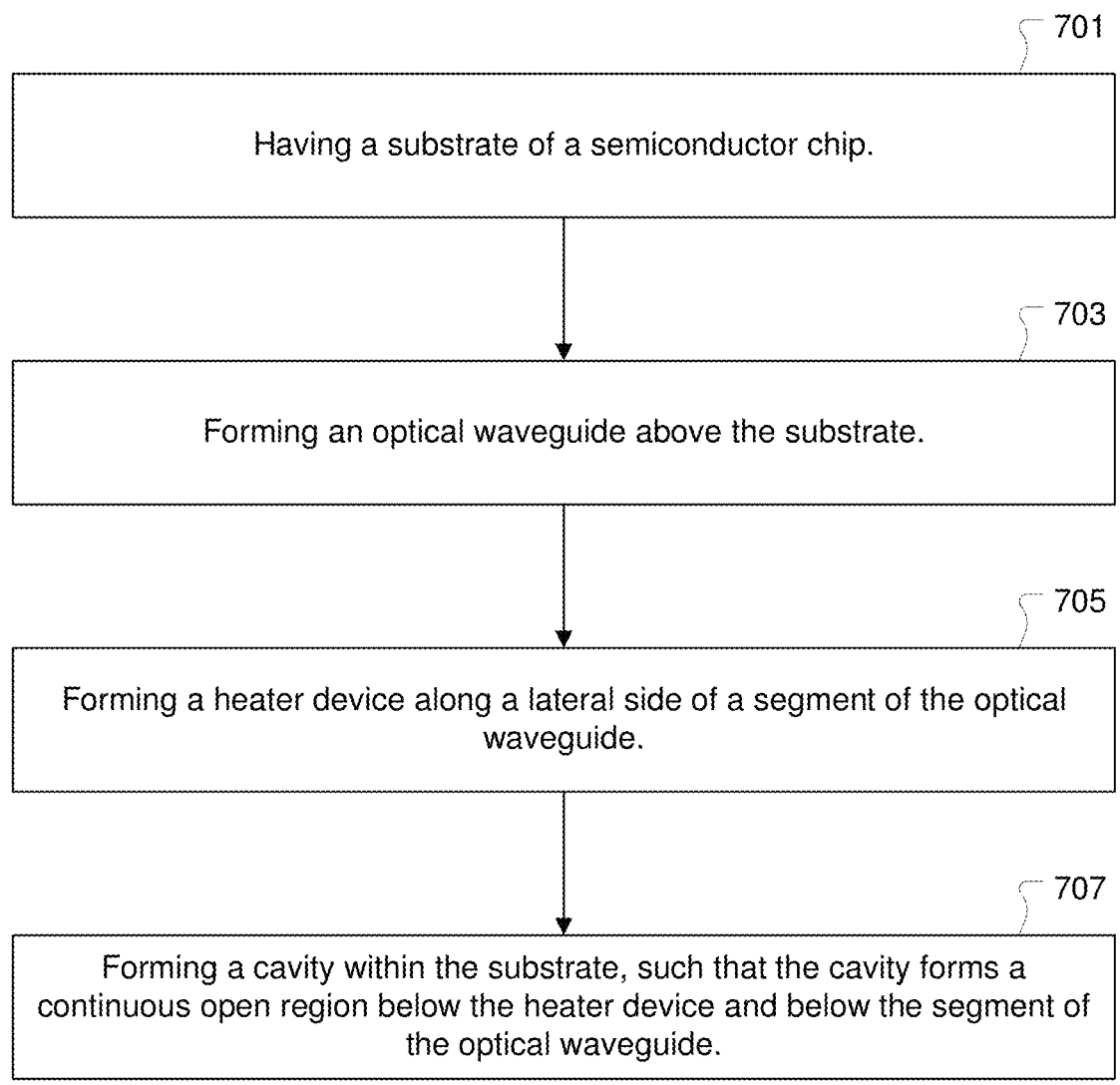
FIG. 7 shows a flowchart of a method for manufacturing a thermo-optic phase shifter, in accordance with some embodiments.

FIG. 7 shows a flowchart of a method for manufacturing a thermo-optic phase shifter 100, 100A, 100B, in accordance with some embodiments. The method includes an operation 701 for having a substrate 101 of a semiconductor chip. The method also includes an operation 703 for forming an optical waveguide 109, 109A, 109B above the substrate 101. The method also includes an operation 705 for forming one or more heater device(s) 113-1, 113-2 along a respective lateral side of a segment of the optical waveguide 109, 109A, 109B. In some embodiments of the method, each of the one or more heater device(s) 113-1, 113-2 has a substantially linear shape along the heated segment of the optical waveguide 109, 109A, 109B. In some embodiments of the method, the heated segment of the optical waveguide 109, 109A, 109B has a substantially linear shape. The method also includes an operation 707 for forming a cavity 117, 117A, 117B within the substrate 101, such that the cavity 117, 117A, 117B forms a continuous open region below the heater device(s) 113-1, 113-2 and below the heated segment(s) of the optical waveguide 109, 109A, 109B. In some embodiments of the method, forming the cavity 117, 117A, 117B includes performing an undercut plasma etching process on the substrate 101. In some embodiments of the method, a BOX layer 103 is formed on the substrate 101, where the optical waveguide 109, 109A, 109B, the heater device(s) 113-1, 113-2, and the thermal transmission structures 115-1, 115-2, 115A-1, 115A-2, 115A-3, 115B-1, 115B-2, 115B-3, 115B-4 are formed over the BOX layer 103, and where the cavity 117, 117A, 117B is formed below the BOX layer 103.

In some embodiments of the method, a thermal transmission structures 115-1, 115-2, 115A-1, 115A-2, 115B-1, 115B-2 are formed between the segment of the optical waveguide 109, 109A, 109B and the adjacent heater device 113-1, 113-2 before forming the cavity 117, 117A, 117B. In some embodiments of the method, each of the thermal transmission structures 115-1, 115-2, 115A-1, 115A-2, 115A-3, 115B-1, 115B-2, 115B-3, 115B-4 is formed to have a vertical size d5 less than a vertical size d1 of the heated segment(s) of the optical waveguide 109, 109A, 109B to avoid optical coupling between a primary optical mode within the segment(s) of the optical waveguide 109, 109A, 109B and the thermal transmission structures 115-1, 115-2, 115A-1, 115A-2, 115A-3, 115B-1, 115B-2, 115B-3, 115B-4. In some embodiments of the method, the optical waveguide 109, 109A, 109B is formed to include an optical mode converter 119 at each location where the optical waveguide 109, 109A, 109B enter or exits a region above the cavity 117, 117A, 117B.

In some embodiments, the thermo-optic phase shifter 100, 100A, 100B disclosed herein is implemented through parameterized, design rule check (DRC)-clean mask-layer layouts. In some embodiments, the thermo-optic phase shifter 100, 100A, 100B structure is defined using a generator program implemented as computer software. The generator program is parameterized to accommodate many different design level and technology specific parameters, including but not limited to the length d2 of the heater devices 113-1, 113-2; the width(s) d4, d8, d9, d13, d14, d15 of the optical waveguide 109, 109A, 109B within the heater region 111, 111A, 111B; the spacings d11, d17, d18 between optical waveguide segments 109A-1, 109A-2, 109B-1, 109B-2, 109B-3 within the heater region 111A, 111B; the topology arrangement of the heater devices 113-1, 113-2, the number of passes of the optical waveguide 109, 109A, 109B through the heater region 111, 111A, 111B; and the size and distribution of the openings used to perform the substrate 101 undercut etching process to form the cavity 117, 117A, 117B, among other parameters. In some embodiments, the generator program utilizes a Berkeley Photonics Generator (BPG) framework to create DRC compliant structures, with an ability to target multiple technologies. The BPG is a Python-based framework that enables the generation and simulation of photonic circuit layouts.

The example thermo-optic phase shifter 100, 100A, 100B embodiments disclosed herein are described within the context of a dual-thickness silicon-on-insulator (SOI) process, in which the heater devices 113, optical waveguides 109, 109A, 109B and thermal transmission structures 115, 115A, 115B are implemented in silicon within the device layer 105, 105A, 105B. However, it should be understood that the principles and configurations of the thermo-optic phase shifters 100, 100A, 100B disclosed herein are not limited to the SOI process. In various embodiments, the principles and configurations of the thermo-optic phase shifters 100, 100A, 100B disclosed herein can be implemented in any suitable technology platform.

It should be understood that the thermo-optic phase shifter 100, 100A, 100B embodiments described herein can be defined by employing various computer-implemented operations involving data stored in computer systems. These operations are those requiring physical manipulation of physical quantities. Any of the operations described herein that form part of the embodiments are useful machine operations. The embodiments also relate to a hardware unit or an apparatus for performing these operations. The apparatus may be specially constructed for a special purpose computer. When defined as a special purpose computer, the computer can also perform other processing, program execution or routines that are not part of the special purpose, while still being capable of operating for the special purpose. In some embodiments, the operations may be processed by a general purpose computer selectively activated or configured by one or more computer programs stored in the computer memory, cache, or obtained over a network. When data is obtained over a network, the data may be processed by other computers on the network, e.g., a cloud of computing resources.

Design and fabrication specifications for the various thermo-optic phase shifter 100, 100A, 100B embodiments described herein can be stored as computer-readable code on a non-transitory computer-readable medium. The non-transitory computer-readable medium is any data storage hardware unit that can store data, which can be thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes, and other optical and non-optical data storage hardware units. The non-transitory computer-readable medium can include computer-readable tangible medium distributed over a network-coupled computer system so that the computer-readable code is stored and executed in a distributed fashion.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

Although the foregoing disclosure includes some detail for purposes of clarity of understanding, it will be apparent that certain changes and modifications can be practiced within the scope of the appended claims. For example, it should be understood that one or more features from any embodiment disclosed herein may be combined with one or more features of any other embodiment disclosed herein. Accordingly, the present embodiments are to be considered as illustrative and not restrictive, and what is claimed is not to be limited to the details given herein, but may be modified within the scope and equivalents of the described embodiments.

What is claimed is:

1. A thermo-optic phase shifter, comprising:
a substrate having a cavity formed into an upper region of the substrate;
an optical waveguide disposed above the substrate, the optical waveguide extending across and above the cavity; and
a heater device disposed along a lateral side of the optical waveguide, the heater device extending across and above the cavity.

2. The thermo-optic phase shifter as recited in claim 1, wherein a segment of the optical waveguide that extends across and above the cavity has a substantially linear shape.

3. The thermo-optic phase shifter as recited in claim 2, wherein the heater device has a substantially linear shape along a lateral side of the heater device closest to the lateral side of the optical waveguide, and wherein the lateral side of the heater device is oriented substantially parallel to the lateral side of the optical waveguide.

4. The thermo-optic phase shifter as recited in claim 1, wherein the heater device includes a plurality of heater device segments, each heater device segment extending between an adjacently positioned pair of contact portions of the heater device, each adjacently positioned pair of contact portions of the heater device including one contact portion electrically connected to a first electrical potential and one contact portion electrically connected to a second electrical potential, such that an electrical current flows between the adjacently positioned pair of contact portions.

5. The thermo-optic phase shifter as recited in claim 1, further comprising:
a thermal transmission structure disposed between the lateral side of the optical waveguide and a lateral side of the heater device closest to the lateral side of the optical waveguide, the thermal transmission structure extending across and above the cavity.

6. The thermo-optic phase shifter as recited in claim 5, wherein a vertical size of the thermal transmission structure is less than a vertical size of the optical waveguide to avoid optical coupling between a primary optical mode of the optical waveguide and the thermal transmission structure.

7. The thermo-optic phase shifter as recited in claim 5, wherein the optical waveguide, the heater device, and the thermal transmission structure are located within a device layer of a semiconductor chip, and wherein a back-end-of-line region of the semiconductor chip is located above the device layer.

8. The thermo-optic phase shifter as recited in claim 7, further comprising:
a buried oxide layer disposed between the substrate and the device layer, the buried oxide layer extending over the cavity and below each of the optical waveguide, the heater device, and the thermal transmission structure.

9. The thermo-optic phase shifter as recited in claim 1, wherein the heater device is a first heater device disposed along a first lateral side of the optical waveguide, the thermo-optic phase shifter including a second heater disposed along a second lateral side of the optical waveguide, the second heater device extending across and above the cavity.

10. The thermo-optic phase shifter as recited in claim 9, wherein a segment of the optical waveguide that extends across and above the cavity has a substantially linear shape, wherein the first heater device has a substantially linear shape along a lateral side of the first heater device closest to the first lateral side of the optical waveguide, the lateral side of the first heater device oriented substantially parallel to the first lateral side of the optical waveguide, wherein the second heater device has a substantially linear shape along a lateral side of the second heater device closest to the second lateral side of the optical waveguide, the lateral side of the second heater device oriented substantially parallel to the second lateral side of the optical waveguide.

11. The thermo-optic phase shifter as recited in claim 10, further comprising:
a first thermal transmission structure disposed between the first lateral side of the optical waveguide and the lateral side of the first heater device closest to the first lateral side of the optical waveguide, the first thermal transmission structure extending across and above the cavity; and
a second thermal transmission structure disposed between the second lateral side of the optical waveguide and the lateral side of the second heater device closest to the second lateral side of the optical waveguide, the second thermal transmission structure extending across and above the cavity.

12. The thermo-optic phase shifter as recited in claim 11, wherein a vertical size of each of the first thermal transmission structure and the second thermal transmission structure is less than a vertical size of the optical waveguide to an extent that avoids optical coupling between a primary optical mode of the optical waveguide and each of the first thermal transmission structure and the second thermal transmission structure.

13. The thermo-optic phase shifter as recited in claim 1, wherein the optical waveguide includes an optical mode converter at each location where the optical waveguide enter or exits a region above the cavity.

14. The thermo-optic phase shifter as recited in claim 1, wherein the optical waveguide includes a plurality of optical waveguide segments that extend across and above the cavity, wherein each laterally adjacent positioned pair of the plurality of optical waveguide segments that extend across and above the cavity is connected by a corresponding loop-back segment of the optical waveguide, wherein the optical waveguide includes a first input/output segment connected to a first outer laterally positioned one of the plurality of optical waveguide segments, and wherein the optical waveguide includes a second input/output segment connected to a second outer laterally positioned one of the plurality of optical waveguide segments.

15. The thermo-optic phase shifter as recited in claim 14, wherein each corresponding loop-back segment of the optical waveguide, the first input/output segment of the optical waveguide, and the second input/output segment of the optical waveguide are positioned over the substrate outside of a lateral boundary of the cavity.

16. The thermo-optic phase shifter as recited in claim 14, wherein each corresponding loop-back segment of the optical waveguide, the first input/output segment of the optical waveguide, and the second input/output segment of the optical waveguide are spaced apart from each other to avoid optical coupling between each other.

17. The thermo-optic phase shifter as recited in claim 14, wherein each of the plurality of optical waveguide segments that extend across and above the cavity has a lateral width set to ensure that optical overlap between any two or more of the plurality of optical waveguide segments that extend across and above the cavity is not phase-matched.

18. The thermo-optic phase shifter as recited in claim 14, wherein the heater device is a first heater device disposed along an outer lateral side of the first outer laterally positioned one of the plurality of optical waveguide segments, and wherein the thermo-optic phase shifter includes a second heater device disposed along an outer lateral side of the second outer laterally positioned one of the plurality of optical waveguide segments, the second heater device extending across and above the cavity.

19. The thermo-optic phase shifter as recited in claim 18, further comprising:
a first outer-positioned thermal transmission structure disposed between the outer lateral side of the first outer laterally positioned one of the plurality of optical waveguide segments and the first heater device, the first thermal transmission structure extending across and above the cavity;
a second outer-positioned thermal transmission structure disposed between the outer lateral side of the second outer laterally positioned one of the plurality of optical waveguide segments and the second heater device, the second thermal transmission structure extending across and above the cavity; and
one or more inner-positioned thermal transmission structure(s) respectively disposed between each laterally adjacent positioned pair of the plurality of optical waveguide segments that extend across and above the cavity.

20. The thermo-optic phase shifter as recited in claim 19, wherein a vertical size of each of the first outer-positioned thermal transmission structure, the second outer-positioned thermal transmission structure, and each of the one or more inner-positioned thermal transmission structures is less than a vertical size of the optical waveguide to avoid optical coupling between a primary optical mode of the optical waveguide and each of the first outer-positioned thermal transmission structure, the second outer-positioned thermal transmission structure, and the one or more inner-positioned thermal transmission structures.

21. A method for manufacturing a thermo-optic phase shifter, comprising:
  having a substrate of a semiconductor chip;
  forming an optical waveguide above the substrate;
  forming a heater device along a lateral side of a segment of the optical waveguide; and
  forming a cavity within the substrate such that the cavity forms a continuous open region below the heater device and below the segment of the optical waveguide.

22. The method as recited in claim 21, wherein forming the cavity includes performing an undercut plasma etching process on the substrate.

* * * * *